United States Patent
Eun et al.

(10) Patent No.: US 12,199,634 B2
(45) Date of Patent: Jan. 14, 2025

(54) DECODING APPARATUS, DECODING METHOD, AND ELECTRONIC APPARATUS

(71) Applicant: Samsung Electronics Co., Ltd., Suwon-si (KR)

(72) Inventors: Yoochang Eun, Suwon-si (KR); Woongjae Han, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 43 days.

(21) Appl. No.: 18/058,388

(22) Filed: Nov. 23, 2022

(65) Prior Publication Data

US 2023/0170921 A1    Jun. 1, 2023

(30) Foreign Application Priority Data

Nov. 26, 2021 (KR) .......................... 10-2021-0166195
May 13, 2022 (KR) .......................... 10-2022-0059104

(51) Int. Cl.
*H03M 13/11* (2006.01)

(52) U.S. Cl.
CPC .... *H03M 13/1131* (2013.01); *H03M 13/1148* (2013.01)

(58) Field of Classification Search
CPC ......... H03M 13/1131; H03M 13/1148; H03M 13/1122; H03M 13/1111; H03M 13/116; H03M 13/114

See application file for complete search history.

(56) References Cited

U.S. PATENT DOCUMENTS

| | | | |
|---|---|---|---|
| 8,291,285 B1 * | 10/2012 | Varnica | H03M 13/1137 714/752 |
| 8,635,517 B2 | 1/2014 | Abu-Surra et al. | |
| 8,726,122 B2 | 5/2014 | Pisek | |

(Continued)

FOREIGN PATENT DOCUMENTS

| KR | 10-0874484 B1 | 12/2008 |
|---|---|---|
| KR | 10-1206137 B1 | 11/2012 |

(Continued)

OTHER PUBLICATIONS

S. Usman, M. M. Mansour and A. Chehab, "A Multi-Gbps Fully Pipelined Layered Decoder for IEEE 802.11n/ac/ax LDPC Codes," 2017 IEEE Computer Society Annual Symposium on VLSI (ISVLSI), Bochum, Germany, 2017.*

(Continued)

*Primary Examiner* — Steve N Nguyen
(74) *Attorney, Agent, or Firm* — Harness, Dickey & Pierce, P.L.C.

(57) ABSTRACT

There is provided a decoding apparatus for decoding a low density parity check (LDPC) code, wherein the decoding apparatus includes a memory a memory configured to store a scheduling table indicating a desired processing order of a plurality of rows included in a parity check matrix and a plurality of columns included in each of the rows of the parity check matrix, and processing circuitry configured to decode the LDPC code based on the scheduling table, the decoding including performing processing on at least one column included in a second scheduled row of the parity check matrix before processing of all columns included in a first scheduled row of the parity check matrix has been completed.

17 Claims, 31 Drawing Sheets

(56) References Cited

U.S. PATENT DOCUMENTS

| | | | |
|---|---|---|---|
| 9,276,610 B2* | 3/2016 | Xia | H03M 13/116 |
| 9,413,390 B1* | 8/2016 | Yin | H03M 13/1117 |
| 9,619,317 B1* | 4/2017 | Lu | H03M 13/3746 |
| 9,634,693 B2 | 4/2017 | Pisek et al. | |
| 9,825,650 B2 | 11/2017 | Sham et al. | |
| 10,171,203 B2 | 1/2019 | Kim | |
| 10,312,939 B2 | 6/2019 | Richardson et al. | |
| 10,567,002 B2 | 2/2020 | Shutkin et al. | |
| 10,680,646 B2 | 6/2020 | Richardson | |
| 10,778,371 B2 | 9/2020 | Loncke et al. | |
| 10,797,727 B1 | 10/2020 | Walke et al. | |
| 10,804,933 B2 | 10/2020 | Kim et al. | |
| 10,826,529 B2 | 11/2020 | Lam et al. | |
| 10,951,235 B2 | 3/2021 | Gunnam et al. | |
| 11,070,236 B2 | 7/2021 | Petrov | |
| 11,316,532 B1* | 4/2022 | Hsu | H03M 13/1145 |
| 2007/0089018 A1* | 4/2007 | Tang | H03M 13/1122 714/752 |
| 2008/0276156 A1* | 11/2008 | Gunnam | H03M 13/616 714/801 |
| 2010/0042896 A1* | 2/2010 | Gunnam | H03M 13/3753 714/752 |
| 2010/0162074 A1 | 6/2010 | Oh et al. | |
| 2015/0301887 A1* | 10/2015 | Zhang | H03M 13/1111 714/764 |
| 2018/0062666 A1* | 3/2018 | Zhang | H03M 13/1122 |
| 2018/0351575 A1* | 12/2018 | Chen | H03M 13/116 |
| 2021/0152282 A1* | 5/2021 | Huang | H04B 7/08 |

FOREIGN PATENT DOCUMENTS

| | | |
|---|---|---|
| KR | 10-1211433 B1 | 12/2012 |
| KR | 10-1307733 B1 | 9/2013 |
| KR | 10-1335419 B1 | 12/2013 |
| KR | 10-1507337 B1 | 4/2015 |
| KR | 10-1803280 B1 | 11/2017 |
| KR | 10-1909942 B1 | 10/2018 |
| KR | 10-2019893 B1 | 9/2019 |
| KR | 10-2131834 B1 | 7/2020 |
| KR | 10-2155539 B1 | 9/2020 |
| KR | 10-2178603 B1 | 11/2020 |
| KR | 10-2197173 B1 | 12/2020 |

OTHER PUBLICATIONS

S. Ajaz and H. Lee, "Area efficient half row pipelined layered LDPC decoder for gigabit wireless communications," 2015 International SoC Design Conference (ISOCC), Gyeongju, Korea (South), 2015.*

O. Boncalo and A. Amaricai, "Ultra High Throughput Unrolled Layered Architecture for QC-LDPC Decoders," 2017 IEEE Computer Society Annual Symposium on VLSI (ISVLSI), Bochum, Germany, 2017.*

* cited by examiner

| Row | Column (CNP) | | | | | | | | | | | | | | | | | | |
|---|---|---|---|---|---|---|---|---|---|---|---|---|---|---|---|---|---|---|---|
| 0 | 2 | 5 | 6 | 9 | 10 | 11 | 13 | 15 | 18 | 19 | 20 | 23 | 0 | 1 | 3 | 12 | 16 | 21 | 22 |
| 1 | 4 | 7 | 8 | 14 | 17 | 24 | 0 | 2 | 3 | 5 | 9 | 11 | 12 | 15 | 16 | 19 | 21 | 22 | 23 |
| 2 | 25 | 1 | 6 | 10 | 13 | 18 | 20 | 0 | 2 | 4 | 5 | 7 | 8 | 9 | 14 | 15 | 17 | 19 | 24 |
| 3 | 3 | 11 | 12 | 16 | 21 | 22 | 0 | 1 | 4 | 6 | 7 | 8 | 10 | 13 | 14 | 17 | 18 | 20 | 25 |
| 4 | 26 | 0 | 1 | | | | | | | | | | | | | | | | |
| 5 | 27 | 3 | 12 | 16 | 21 | 22 | 0 | 1 | | | | | | | | | | | |

FIG. 11B

| Row | Column (VNP) | | | | | | | | | | | | | | | | | | |
|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 |
| 0 | 0 | 2 | 3 | 5 | 9 | 11 | 12 | 15 | 16 | 19 | 21 | 22 | 23 | 1 | 6 | 10 | 13 | 18 | 20 |
| 1 | 0 | 2 | 4 | 5 | 7 | 8 | 9 | 14 | 15 | 17 | 19 | 24 | 3 | 11 | 12 | 16 | 21 | 22 | 23 |
| 2 | 0 | 1 | 4 | 6 | 7 | 8 | 10 | 13 | 14 | 17 | 18 | 20 | 25 | 2 | 5 | 9 | 15 | 19 | 24 |
| 3 | 0 | 1 | 3 | 12 | 16 | 21 | 22 | 4 | 6 | 7 | 8 | 10 | 11 | 13 | 14 | 17 | 18 | 20 | 25 |
| 4 | 0 | 1 | 26 | | | | | | | | | | | | | | | | |
| 5 | 0 | 1 | 3 | 12 | 16 | 21 | 22 | 27 | | | | | | | | | | | |

FIG. 12A

| CLK | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|
| R1 | 2 | 5 | 6 | 9 | 10 | 11 | 13 | 15 | 18 | 19 | 20 | 23 | 0 | 1 | 3 | 12 | 16 | 21 | 22 | 4 | 7 | 8 | 14 | 17 | 24 | 0 | 2 | 3 | 5 | 9 | 11 | 12 |
| R2 |   | 2 | 5 | 6 | 9 | 10 | 11 | 13 | 15 | 18 | 19 | 20 | 23 | 0 | 1 | 3 | 12 | 16 | 21 | 22 | 4 | 7 | 8 | 14 | 17 | 24 | 0 | 2 | 3 | 5 | 9 | 11 |
| R3 |   |   | 2 | 5 | 6 | 9 | 10 | 11 | 13 | 15 | 18 | 19 | 20 | 23 | 0 | 1 | 3 | 12 | 16 | 22 | 4 | 7 | 8 | 14 | 17 | 24 | 0 | 2 | 3 | 5 | 9 |   |
| R4 |   |   |   | 2 | 5 | 6 | 9 | 10 | 11 | 13 | 15 | 18 | 19 | 20 | 23 | 0 | 1 | 3 | 12 | 16 | 21 | 4 | 7 | 8 | 14 | 17 | 24 | 0 | 2 | 3 | 5 |   |
| R5 |   |   |   |   | 2 | 5 | 6 | 9 | 10 | 11 | 13 | 15 | 18 | 19 | 20 | 23 | 0 | 1 | 3 | 12 | 16 | 22 | 4 | 7 | 8 | 14 | 17 | 24 | 0 | 2 | 3 |   |
| W1 |   |   |   |   |   |   |   |   |   |   |   |   |   |   |   |   |   |   |   |   |   |   | 0 | 2 | 3 | 5 | 9 | 11 | 12 | 15 | 16 | 19 |
| W2 |   |   |   |   |   |   |   |   |   |   |   |   |   |   |   |   |   |   |   |   |   |   |   | 0 | 2 | 3 | 5 | 9 | 11 | 12 | 15 | 16 |
| W3 |   |   |   |   |   |   |   |   |   |   |   |   |   |   |   |   |   |   |   |   |   |   |   |   | 0 | 2 | 3 | 5 | 9 | 11 | 12 | 15 |

Row 0 (CLK 15–27), Row 1 (CLK 28–32); Row 0 (W rows)

| CLK | 65 | 66 | 67 | 68 | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 | 92 | 93 | 94 | 95 | 96 |
|---|---|---|---|---|---|---|---|---|---|---|---|---|---|---|---|---|---|---|---|---|---|---|---|---|---|---|---|---|---|---|---|---|
| R1 | 1 | 4 | 6 | 7 | 8 | 10 | 13 | 14 | 17 | 18 | 20 | | | | | | | | 0 | 1 | 27 | 3 | 12 | 16 | 21 | 22 | | | | | | |
| R2 | 0 | 1 | 4 | 6 | 7 | 8 | 10 | 13 | 14 | 17 | 18 | 20 | 25 | 26 | | | | | | 0 | 1 | 27 | 3 | 12 | 16 | 21 | 22 | | | | | |
| R3 | 22 | 0 | 1 | 4 | 6 | 7 | 8 | 10 | 13 | 14 | 17 | 18 | 20 | 25 | 26 | | | | | | 0 | 1 | 27 | 3 | 12 | 16 | 21 | 22 | | | | |
| R4 | 21 | 22 | 0 | 1 | 4 | 6 | 7 | 8 | 10 | 13 | 14 | 17 | 18 | 20 | 25 | 26 | | | | | | 0 | 1 | 27 | 3 | 12 | 16 | 21 | 22 | | | |
| R5 | 16 | 21 | 22 | 0 | 1 | 4 | 6 | 7 | 8 | 10 | 13 | 14 | 17 | 18 | 20 | 25 | 26 | | | | | | 0 | 1 | 27 | 3 | 12 | 16 | 21 | 22 | | |
| W1 | 7 | 8 | 10 | 13 | 14 | 17 | 18 | 20 | 25 | 2 | 5 | 9 | 15 | 19 | 24 | 0 | 1 | 3 | 12 | 16 | 21 | 22 | 4 | 6 | 7 | 8 | 10 | 11 | 13 | 14 | 17 | 18 |
| W2 | 6 | 7 | 8 | 10 | 13 | 14 | 17 | 18 | 20 | 25 | 2 | 5 | 9 | 15 | 19 | 24 | 0 | 1 | 3 | 12 | 16 | 21 | 22 | 4 | 6 | 7 | 8 | 10 | 11 | 13 | 14 | 17 |
| W3 | 4 | 6 | 7 | 8 | 10 | 13 | 14 | 17 | 18 | 20 | 25 | 2 | 5 | 9 | 15 | 19 | 24 | 0 | 1 | 3 | 12 | 16 | 21 | 22 | 4 | 6 | 7 | 8 | 10 | 11 | 13 | 14 |

FIG. 12D

| CLK | 97 | 98 | 99 | 100 | 101 | 102 | 103 | 104 | 105 | 106 | 107 | 108 | 109 | 110 | 111 | 112 | 113 | 114 | 115 | 116 | 117 | 118 | 119 | 120 | 121 | 122 | 123 | 124 | 125 | 126 | 127 | 128 |
|---|---|---|---|---|---|---|---|---|---|---|---|---|---|---|---|---|---|---|---|---|---|---|---|---|---|---|---|---|---|---|---|---|
| R1 |   |   |   |   |   |   |   | 2 | 5 | 6 | 9 | 10 | 11 | 13 | 15 | 18 | 19 | 20 | 23 | 0 | 1 | 3 | 12 | 16 | 21 | 22 | 4 | 7 | 8 | 14 | 17 | 24 |
| R2 |   |   |   |   |   |   | 1 | 1 | 2 | 5 | 6 | 9 | 10 | 11 | 13 | 15 | 18 | 19 | 20 | 23 | 0 | 1 | 3 | 12 | 16 | 21 | 22 | 4 | 7 | 8 | 14 | 17 |
| R3 |   |   |   |   |   |   | 0 | 1 | 2 | 5 | 6 | 9 | 10 | 11 | 13 | 15 | 18 | 19 | 20 | 23 | 0 | 1 | 3 | 12 | 16 | 21 | 22 | 4 | 7 | 8 | 14 |
| R4 |   |   |   |   |   |   |   | 0 | 1 | 2 | 5 | 6 | 9 | 10 | 11 | 13 | 15 | 18 | 19 | 20 | 23 | 0 | 1 | 3 | 12 | 16 | 21 | 22 | 4 | 7 | 8 |
| R5 |   |   |   |   |   |   |   |   | 0 | 1 | 2 | 5 | 6 | 9 | 10 | 11 | 13 | 15 | 18 | 19 | 20 | 23 | 0 | 1 | 3 | 12 | 16 | 21 | 22 | 4 | 7 |
| W1 | 20 | 25 | 0 | 1 | 26 |   |   |   |   |   |   |   |   |   |   |   | 27 | 22 | 21 | 16 | 12 | 3 | 1 | 0 | 2 | 3 | 5 |
| W2 | 18 | 20 | 25 | 0 | 1 | 26 |   |   |   |   |   |   |   | 27 | 22 | 21 | 16 | 12 | 3 | 1 | 0 | 2 | 3 |
| W3 | 17 | 18 | 20 | 25 | 0 | 1 | 26 |   |   |   |   |   |   |   |   |   |   |   |   |   |   |   |   |   |   |   |   |   |   | 0 | 2 |

Row 5 · Row 0 · Row 1 · Row 0
Row 3 · Row 4 · Row 5

FIG. 13A

| Row | Column (CNP) | | | | | | | | | | | | | | | | | | | |
|---|---|---|---|---|---|---|---|---|---|---|---|---|---|---|---|---|---|---|---|---|
| 4 | 26 | 0 | 1 | | | | | | | | | | | | | | | | | |
| 1 | 23 | 2 | 5 | 9 | 15 | 12 | 19 | 24 | 3 | 4 | 7 | 8 | 11 | 12 | 14 | 16 | 17 | 21 | 22 | |
| 5 | 27 | 1 | 0 | 3 | | | | | | | | | | | | | | | | |
| 0 | 6 | 10 | 13 | 18 | 20 | 2 | 5 | 9 | 11 | 15 | 19 | 23 | 0 | 1 | 3 | 12 | 16 | 21 | 22 | 0 |
| 2 | 25 | 4 | 7 | 8 | 14 | 17 | 24 | 0 | 1 | 2 | 5 | 6 | 9 | 10 | 13 | 15 | 18 | 19 | 20 | |
| 3 | 3 | 11 | 12 | 16 | 21 | 22 | 0 | 1 | 4 | 6 | 7 | 8 | 10 | 13 | 14 | 17 | 18 | 20 | 25 | |

FIG. 13B

| Row | Column (VNP) | | | | | | | | | | | | | | | | | | |
|---|---|---|---|---|---|---|---|---|---|---|---|---|---|---|---|---|---|---|---|
| 4 | 0 | 1 | 26 | | | | | | | | | | | | | | 24 | | | |
| 1 | 0 | 3 | 12 | 16 | 21 | 22 | 2 | 5 | 9 | 11 | 15 | 19 | 23 | 4 | 7 | 8 | 14 | 17 | | 24 |
| 5 | 0 | 1 | 3 | 12 | 16 | 21 | 22 | 27 | | | | | | | | | | | | |
| 0 | 0 | 1 | 2 | 5 | 6 | 9 | 10 | 13 | 15 | 18 | 19 | 20 | 3 | 11 | 12 | 16 | 21 | 22 | | 23 |
| 2 | 0 | 1 | 4 | 6 | 7 | 8 | 10 | 13 | 14 | 17 | 18 | 20 | 25 | 2 | 5 | 9 | 15 | 19 | | 24 |
| 3 | 0 | 1 | 3 | 4 | 7 | 8 | 11 | 12 | 14 | 16 | 17 | 21 | 22 | 6 | 10 | 13 | 18 | 20 | | 25 |

FIG. 14A

| CLK | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|
| R1 | 23 | 2 | 5 | 9 | 15 | 26 | 0 | 11 | 19 | 24 | 3 | 4 | 7 | 8 | 11 | 12 | 14 | 16 | 17 | 21 | 22 | 0 | 6 | 10 | 13 | 18 | 27 | 1 | 0 | 3 | 12 | 16 |
| R2 |  | 23 | 2 | 5 | 9 | 15 | 26 | 0 | 11 | 19 | 24 | 3 | 4 | 7 | 8 | 11 | 12 | 14 | 16 | 17 | 21 | 22 | 0 | 6 | 10 | 13 | 18 | 27 | 1 | 0 | 3 | 12 |
| R3 |  |  | 23 | 2 | 5 | 9 | 15 | 26 | 0 | 11 | 19 | 24 | 3 | 4 | 7 | 8 | 11 | 12 | 14 | 16 | 17 | 21 | 22 | 0 | 6 | 10 | 13 | 18 | 27 | 1 | 0 | 3 |
| R4 |  |  |  | 23 | 2 | 5 | 9 | 15 | 26 | 0 | 11 | 19 | 24 | 3 | 4 | 7 | 8 | 11 | 12 | 14 | 16 | 17 | 21 | 22 | 0 | 6 | 10 | 13 | 18 | 27 | 1 | 0 |
| R5 |  |  |  |  | 23 | 2 | 5 | 9 | 15 | 26 | 0 | 11 | 19 | 24 | 3 | 4 | 7 | 8 | 11 | 12 | 14 | 16 | 17 | 21 | 22 | 0 | 6 | 10 | 13 | 18 | 27 | 1 |
| W1 |  |  |  |  |  |  |  |  |  |  |  | 0 | 1 | 26 |  |  |  |  |  |  |  | 0 | 3 | 12 | 16 | 21 | 22 |  |  |  |  | 2 |
| W2 |  |  |  |  |  |  |  |  |  |  |  |  | 0 | 1 | 26 |  |  |  |  |  |  |  | 0 | 3 | 12 | 16 | 21 | 22 |  |  |  | 22 |
| W3 |  |  |  |  |  |  |  |  |  |  |  |  |  | 0 | 1 | 26 |  |  |  |  |  |  |  | 0 | 3 | 12 | 16 | 21 | 22 |  |  | 21 |

Row 1 → (R1 cols 1–5)    Row 4 → (R1 cols 6–10)    Row 1 → (R1 cols 19–22)    Row 0 → (R1 cols 23–27)    Row 5 → (R1 cols 28–32)

Row 4 → (W cols 11–16)    Row 1 → (W cols 22–32)

FIG. 14B

| CLK | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 | 64 |
|---|---|---|---|---|---|---|---|---|---|---|---|---|---|---|---|---|---|---|---|---|---|---|---|---|---|---|---|---|---|---|---|---|
| R1 | 21 | 22 | 20 | 2 | 5 | 9 | 11 | 15 | 19 | 23 | 0 | 1 | 3 | 12 | 16 | 21 | 22 | 25 | 4 | 7 | 8 | 14 | 17 | 24 | 0 | 1 | 2 | 5 | 6 | 9 | 10 | 13 |
| R2 | 16 | 21 | 22 | 20 | 2 | 5 | 9 | 11 | 15 | 19 | 23 | 0 | 1 | 3 | 12 | 16 | 21 | 22 | 25 | 4 | 7 | 8 | 14 | 17 | 24 | 0 | 1 | 2 | 5 | 6 | 9 | 10 |
| R3 | 12 | 16 | 21 | 22 | 20 | 2 | 5 | 9 | 11 | 15 | 19 | 23 | 0 | 1 | 3 | 12 | 16 | 21 | 22 | 25 | 4 | 7 | 8 | 14 | 17 | 24 | 0 | 1 | 2 | 5 | 6 | 9 |
| R4 | 3 | 12 | 16 | 21 | 22 | 20 | 2 | 5 | 9 | 11 | 15 | 19 | 23 | 0 | 1 | 3 | 12 | 16 | 21 | 22 | 25 | 4 | 7 | 8 | 14 | 17 | 24 | 0 | 1 | 2 | 5 | 6 |
| R5 | 0 | 3 | 12 | 16 | 21 | 22 | 20 | 2 | 5 | 9 | 11 | 15 | 19 | 23 | 0 | 1 | 3 | 12 | 16 | 21 | 22 | 25 | 4 | 7 | 8 | 14 | 17 | 24 | 0 | 1 | 2 | 5 |
| W1 | 5 | 9 | 11 | 15 | 19 | 23 | 0 | 1 | 3 | 12 | 16 | 21 | 22 | 27 | 4 | 7 | 8 | 14 | 17 | 24 | 0 | 1 | 2 | 5 | 6 | 9 | 10 | 13 | 15 | 18 | 19 | 20 |
| W2 | 2 | 5 | 9 | 11 | 15 | 19 | 23 | 0 | 1 | 3 | 12 | 16 | 21 | 22 | 27 | 4 | 7 | 8 | 14 | 17 | 24 | 0 | 1 | 2 | 5 | 6 | 9 | 10 | 13 | 15 | 18 | 19 |
| W3 | 22 | 2 | 5 | 9 | 11 | 15 | 19 | 23 | 0 | 1 | 3 | 12 | 16 | 21 | 22 | 27 | 4 | 7 | 8 | 14 | 17 | 24 | 0 | 1 | 2 | 5 | 6 | 9 | 10 | 13 | 15 | 18 |

| Row | Column (CNP) | | | | | | | | | | | | | | | | | | |
|---|---|---|---|---|---|---|---|---|---|---|---|---|---|---|---|---|---|---|---|
| 4 | 26 | 1 | 0 | 8 | 9 | 12 | 14 | 15 | 16 | 17 | 19 | 21 | 22 | 24 | 11 | 3 | 7 | 23 | 0 |
| 1 | 2 | 4 | 5 | 3 | 12 | 16 | 21 | 22 | | | | | | | | | | | |
| 5 | 27 | 1 | 0 | 18 | 20 | 2 | 5 | 9 | 11 | 15 | 19 | 23 | 0 | 1 | 3 | 12 | 16 | 21 | 22 |
| 0 | 6 | 10 | 13 | 6 | 10 | 11 | 13 | 18 | 20 | | | | | | | | | | |
| 6 | 28 | 17 | 0 | 14 | 25 | 1 | 8 | 22 | 0 | 6 | 10 | 11 | 13 | 17 | 18 | 20 | 22 | | |
| 3 | 4 | 7 | 8 | 4 | 7 | 8 | 14 | | | | | | | | | | | | |
| 7 | 29 | 0 | 1 | 15 | 19 | 24 | 6 | 10 | | | | | | | | | | | |
| 2 | 2 | 5 | 9 | 12 | 16 | 21 | 22 | 0 | 1 | 18 | 20 | 22 | 0 | 11 | 13 | 21 | | | |
| 8 | 30 | 3 | 12 | 16 | 21 | 18 | 22 | 0 | 13 | 17 | 18 | 0 | 1 | 4 | 7 | 8 | 14 | 20 | |
| 9 | 31 | 11 | 10 | 13 | 17 | 14 | 0 | 1 | 19 | 24 | 20 | 25 | | | | | | | |
| 10 | 32 | 2 | 4 | 7 | 8 | 1 | | | | | | | | | | | | | |
| 11 | 33 | 23 | 12 | 16 | 21 | 22 | 0 | 1 | | | | | | | | | | | |
| 12 | 34 | 10 | 11 | 13 | 18 | 1 | 0 | | | | | | | | | | | | |
| 13 | 35 | 3 | 20 | 7 | 23 | 0 | | | | | | | | | | | | | |

FIG. 15B

| Row | Column (VNP0) | | | | | | | | | | | | | | | | | | |
|---|---|---|---|---|---|---|---|---|---|---|---|---|---|---|---|---|---|---|---|
| 4 | | | | | | | | | | | | | | | | | | | |
| 1 | 3 | 12 | 16 | 21 | 22 | 2 | 5 | 9 | 11 | 15 | 19 | 23 | 17 | 4 | 7 | 8 | 14 | 24 | 11 |
| 5 | 3 | 12 | 16 | 21 | 22 | | | | | | | | | | | | | | |
| 0 | 6 | 10 | 11 | 13 | 18 | 20 | 3 | 12 | 16 | 21 | 22 | 2 | 5 | 9 | 15 | 19 | 23 | | |
| 6 | 6 | 10 | 11 | 13 | 17 | 18 | | | 20 | | 25 | | | | | 22 | 11 | | |
| 3 | 4 | 7 | 8 | 14 | 6 | 10 | 13 | 17 | 18 | 20 | 25 | 3 | 12 | 16 | 21 | 22 | | | |
| 7 | 4 | 7 | 8 | 14 | | | | | | | | | | | | | | | |
| 2 | 24 | 10 | 13 | 17 | 18 | 20 | 2 | 4 | 7 | 8 | 14 | 5 | 6 | 9 | 15 | 25 | | | |
| 8 | 12 | 16 | 21 | 22 | 3 | 19 | 24 | | | | | | | | | | | | |
| 9 | 10 | 11 | 13 | 18 | 17 | 20 | | | | | | | | | | | | | |
| 10 | 7 | 2 | 4 | 8 | 14 | | | | | | | | | | | | | | |
| 11 | 23 | 12 | 16 | 21 | 22 | | | | | | | | | | | | | | |
| 12 | 11 | 10 | 13 | 18 | | | | | | | | | | | | | | | |
| 13 | 3 | 7 | 23 | 20 | | | | | | | | | | | | | | | |

FIG. 15C

| Row | Column | (VNP1) |
|-----|--------|--------|
| 4   | 0      | 1   26 |
| 1   | 0      |        |
| 5   | 0      | 1   27 |
| 0   | 0      | 1      |
| 6   | 0      | 28     |
| 3   | 0      | 1      |
| 7   | 0      | 1   29 |
| 2   | 0      | 1      |
| 8   | 0      | 1   30 |
| 9   | 1      | 0   31 |
| 10  | 1      | 32     |
| 11  | 1      | 0   33 |
| 12  | 0      | 1   34 |
| 13  | 0      | 35     |

(Figure shows a complex timing/scheduling table with CLK columns numbered 29-56, rows labeled R1-R5 and W1-W3 (with VNP0/VNP1 sub-rows), and row group labels Row 0, Row 5, Row 1, Row 0, Row 3, Row 6, Row 1, Row 5, Row 0.)

| CLK | | 85 | 86 | 87 | 88 | 89 | 90 | 91 | 92 | 93 | 94 | 95 | 96 | 97 | 98 | 99 | 100 | 101 | 102 | 103 | 104 | 105 | 106 | 107 | 108 | 109 | 110 | 111 | 112 | 113 |
|---|---|---|---|---|---|---|---|---|---|---|---|---|---|---|---|---|---|---|---|---|---|---|---|---|---|---|---|---|---|---|
| R1 | | 14 | 24 | 6 | 10 | 13 | 17 | 18 | 20 | 25 | 0 | 1 | 4 | 7 | 8 | 14 | 3 | 12 | 16 | 21 | 22 | 0 | 1 | 19 | 24 | 11 | 10 | 17 | 13 | 18 |
| R2 | | 8 | 14 | 24 | 6 | 10 | 13 | 17 | 18 | 20 | 25 | 0 | 1 | 4 | 7 | 8 | 14 | 3 | 12 | 16 | 21 | 22 | 0 | 1 | 19 | 24 | 11 | 10 | 17 | 13 |
| R3 | | 7 | 8 | 14 | 24 | 6 | 10 | 13 | 17 | 18 | 20 | 25 | 0 | 1 | 4 | 7 | 8 | 14 | 3 | 12 | 16 | 21 | 22 | 0 | 1 | 19 | 24 | 11 | 10 | 17 |
| R4 | | 4 | 7 | 8 | 14 | 24 | 6 | 10 | 13 | 17 | 18 | 20 | 25 | 0 | 1 | 4 | 7 | 8 | 14 | 3 | 12 | 16 | 21 | 22 | 0 | 1 | 19 | 24 | 11 | 10 |
| R5 | | 1 | 4 | 7 | 8 | 14 | 24 | 6 | 10 | 13 | 17 | 18 | 20 | 25 | 0 | 1 | 4 | 7 | 8 | 14 | 3 | 12 | 16 | 21 | 22 | 0 | 1 | 19 | 24 | 11 |
| W1 | VNP0 | 17 | 18 | 20 | 25 | 0 | 1 | 4 | 7 | 8 | 14 | 3 | 12 | 16 | 21 | 22 | | | | 19 | 24 | 10 | 13 | 17 | 18 | 20 | 2 | 4 | 7 | 8 |
| W1 | VNP1 | | | | | | | 1 | 29 | | | | | | 11 | | | | | | | | | | | | | 0 | | 1 |
| W2 | VNP0 | 13 | 17 | 18 | 20 | 25 | 0 | 1 | 4 | 7 | 8 | 14 | 3 | 12 | 16 | 21 | 22 | 11 | | | 0 | 1 | 19 | 24 | 10 | 13 | 17 | 18 | 20 | 2 |
| W2 | VNP1 | | | | | | | 0 | 1 | 29 | | | | | | 11 | 22 | 11 | | | | | | | | | | | | |
| W3 | VNP0 | 10 | 13 | 17 | 18 | 20 | 25 | 4 | 7 | 8 | 14 | 3 | 12 | 16 | 21 | 22 | | | | 0 | 1 | 19 | 24 | 10 | 13 | 17 | 18 | 20 | 2 | 4 |

DECODING APPARATUS, DECODING METHOD, AND ELECTRONIC APPARATUS

CROSS-REFERENCE TO RELATED APPLICATIONS

This U.S. non-provisional application is based on and claims the benefit of priority under 35 U.S.C. § 119 to Korean Patent Application Nos. 10-2021-0166195, filed on Nov. 26, 2021, and 10-2022-0059104, filed on May 13, 2022, in the Korean Intellectual Property Office, the disclosures of each of which are incorporated by reference herein in their entireties.

BACKGROUND

Various example embodiments of the inventive concepts relate to a decoding apparatus, and more particularly, to an apparatus for decoding a low density parity check (LDPC) code based on a scheduling table, a system including the apparatus, and/or a method of operating the apparatus.

When data is transmitted and received between a transmitter and a receiver in a communication system, errors may occur due to noise in the communication channel. As described above, an error caused by the communication channel may be corrected by performing encoding and decoding using an error correcting code. An LDPC code, which is one type of error correcting code, has superior error correction performance compared to other error correcting codes as the length of the code increases, and thus is used with 5th generation (5G) communication systems.

In this case, due to an improvement in the performance of electronic apparatuses used in the 5G communication system, the amount of reception of data encoded with the LDPC code has increased. As described above, because an electronic apparatus receives more data, decoding of the LDPC code by the electronic apparatus also needs to be processed faster. Therefore, it is desired and/or necessary to develop methods of processing the decoding of the LDPC code faster.

SUMMARY

Various example embodiments of the inventive concepts provide a decoding apparatus capable of decoding a low density parity check (LDPC) code at a higher speed.

According to an aspect of at least one example embodiment of the inventive concepts, there is provided a decoding apparatus for decoding a low density parity check (LDPC) code, the decoding apparatus including a memory configured to store a scheduling table indicating a desired processing order of a plurality of rows included in a parity check matrix and a plurality of columns included in each of the rows of the parity check matrix, and processing circuitry configured to decode the LDPC code based on the scheduling table, the decoding including performing processing on at least one column included in a second scheduled row of the parity check matrix before processing of all columns included in a first scheduled row of the parity check matrix has been completed.

According to another aspect of at least one example embodiment of the inventive concepts, there is provided a decoding method of decoding a low density parity check (LDPC) code, the decoding method including receiving the LDPC code, and decoding the LDPC code based on a scheduling table, the scheduling table indicating a processing order of a plurality of rows included in a parity check matrix and a plurality of columns included in each of the plurality of rows of the parity check matrix, the decoding of the LDPC code including performing processing on a column included in a second scheduled row of the parity check matrix before processing on all columns included in a first scheduled row of the parity check matrix has been completed.

According to another aspect of at least one example embodiment of the inventive concepts, there is provided an electronic apparatus including a receiver configured to receive a low density parity check (LDPC) code, a memory configured to store a scheduling table indicating a desired processing order of a plurality of rows included in a parity check matrix and a plurality of columns included in each of the rows of the parity check matrix, and processing circuitry configured to decode the LDPC code based on the scheduling table, the decoding including independently performing variable node processing on variable nodes that do not correspond to a puncturing area or a diagonal matrix area of the parity check matrix, and performing variable node processing on variable nodes corresponding to the puncturing area or the diagonal matrix area of the parity check matrix.

BRIEF DESCRIPTION OF THE DRAWINGS

Various example embodiments of the inventive concepts will be more clearly understood from the following detailed description taken in conjunction with the accompanying drawings in which:

FIG. 9 is a diagram illustrating an example of a parity check matrix used in a 5th generation (5G) communication system according to some example embodiments;

FIGS. 11A and 11B are diagrams illustrating an example of an order of performing check node processing and variable node processing by a decoding apparatus, according to a comparative example;

FIGS. 12A to 12D are diagrams illustrating an example of a scheduling table used by a decoding apparatus according to a comparative example;

FIGS. 13A and 13B are diagrams illustrating an example of an order of performing check node processing and variable node processing by a decoding apparatus, according to at least one example embodiment;

FIGS. 14A to 14D are diagrams illustrating an example of a scheduling table used by a decoding apparatus, according to at least one example embodiment;

FIGS. 15A to 15C are diagrams illustrating an example of an order of performing check node processing and variable node processing by a decoding apparatus, according to at least one example embodiment; and FIGS. 16A to 16F are diagrams illustrating an example of a scheduling table used by a decoding apparatus, according to at least one example embodiment.

DETAILED DESCRIPTION

Hereinafter, various example embodiments will be described in detail with reference to the accompanying drawings.

Figure 1:
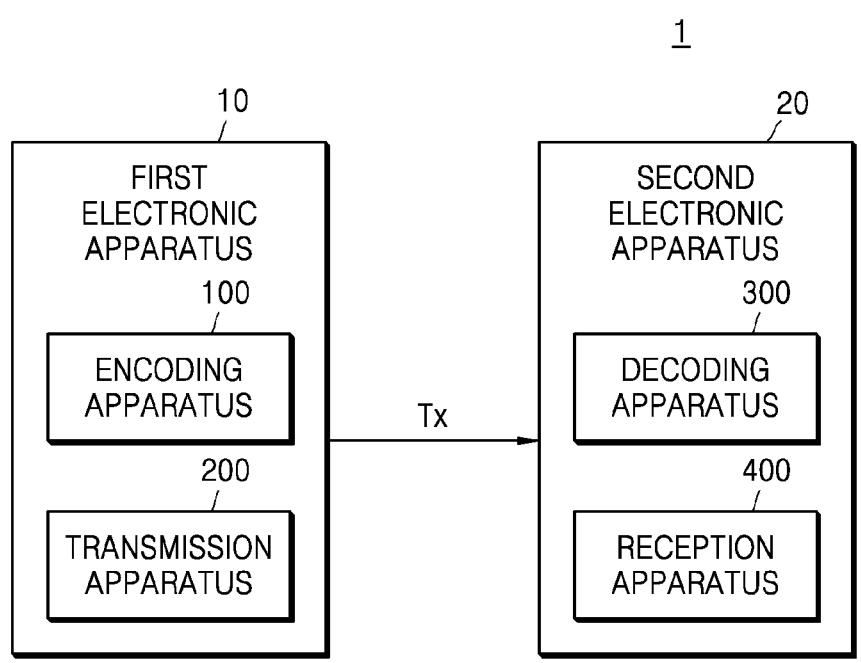
FIG. 1 is a block diagram illustrating a communication system according to at least one example embodiment.

FIG. 1 is a block diagram illustrating a communication system according to at least one example embodiment.

Referring to FIG. 1, a communication system 1 according to at least one example embodiment may include a first electronic apparatus 10 and a second electronic apparatus 20, but the example embodiments are not limited thereto, and for example, the communication system 1 may include a greater number of electronic apparatuses and/or other devices. The first electronic apparatus 10 and the second electronic apparatus 20 may be apparatuses that communicate with each other via at least one wireless channel included in the communication system 1, but are not limited thereto, and for example may communicate using at least one wired channel and/or a combination of wireless and wired channels, etc. For example, each of the first electronic apparatus 10 and/or the second electronic apparatus 20 may be a base station and/or a terminal in a cellular-based communication system, such as a 5th generation (5G) system, a 4G system, a WiFi system, a Bluetooth system, etc., but the example embodiments are not limited thereto.

The first electronic apparatus 10 may include an encoding apparatus 100 and/or a transmission apparatus 200, etc., but is not limited thereto, and for example, may include a greater or lesser number of constituent elements.

The encoding apparatus 100 may generate at least one codeword by encoding data to be transmitted to the second electronic apparatus 20 using, for example, a low density parity check (LDPC) code, but is not limited thereto. In this case, the encoding apparatus 100 may perform encoding by using a parity check matrix. For example, assuming the parity check matrix is H, and the codeword generated by the encoding apparatus 100 is x, the parity check matrix and the codeword may satisfy a relationship of Hx=0.

The transmission apparatus 200 may generate at least one transmission signal Tx by modulating the codeword, etc. In addition, the transmission apparatus 200 may transmit the transmission signal Tx to the second electronic apparatus 20.

The second electronic apparatus 20 may include a decoding apparatus 300 and/or a reception apparatus 400, etc., but is not limited thereto, and for example, may include a greater or lesser number of constituent elements.

The reception apparatus 400 may receive the transmission signal Tx from the first electronic apparatus 10, etc., but is not limited thereto. In addition, the reception apparatus 400 may generate the LDPC code by modulating the transmission signal Tx.

The decoding apparatus 300 may generate, decode, and/or reconstruct, etc., the data transmitted by the first electronic apparatus 10 by performing decoding using the LDPC code, but the example embodiments are not limited thereto. For example, the decoding apparatus 300 may perform decoding by using the same parity check matrix as the parity check matrix used by the encoding apparatus 100, etc.

According to some example embodiments, the decoding apparatus 300 may decode the LDPC code by using a layered scheduling method of decoding the parity check matrix into a plurality of layers, and sequentially decoding each layer, but is not limited thereto. In this case, one row of the parity check matrix may be referred to as a layer.

As described below with reference to FIGS. 11A and 11B, after variable node processing on a specific column included in a row of the parity check matrix to be processed first is completed, a stall may occur when check node processing is performed on a specific column included in a row of the parity check matrix to be processed next.

According to at least one example embodiment, the decoding apparatus 300 may decode the LDPC code by performing processing on a column included in a second row of the parity check matrix before processing all of the columns included in a first row of the parity check matrix is completed. That is, the decoding apparatus 300 may perform processing on one layer before processing on another layer is completed. As described above, the decoding apparatus 300 according to at least one example embodiment may reduce a stall that may occur (and/or reduce the probability that a stall occurs) during a decoding process, and accordingly, the LDPC code may be decoded faster.

A detailed structure and operation of the decoding apparatus 300 according to at least one example embodiment of the inventive concepts is described below in more detail.

Figure 2:
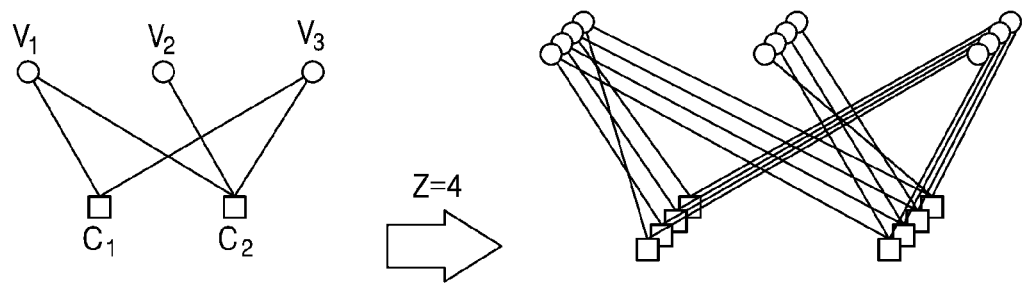
FIG. 2 is a diagram illustrating an example of a parity check matrix of a low density parity check (LDPC) code and a Tanner graph corresponding to the parity check matrix according to some example embodiments.

FIG. 2 is a diagram illustrating an example of a parity check matrix of an LDPC code and a Tanner graph corresponding to the parity check matrix according to at least one example embodiment.

Referring to FIG. 2, FIG. 2 illustrates a parity check matrix H having a size of 2*3 and a Tanner graph corresponding to the parity check matrix are on the left side of the figure.

The LDPC code may be decoded through a process of exchanging messages on the Tanner graph corresponding to the parity check matrix H. Each element of the parity check matrix H may indicate a connection between a check node and a variable node on the Tanner graph. In this case, each row of the parity check matrix H may correspond to a check node of the Tanner graph, and each column of the parity check matrix H may correspond to a variable node of the Tanner graph, etc.

For example, an element in a first row and a first column of the parity check matrix H may indicate whether a message is exchanged between a first check node $C_i$ and a first variable node $V_i$ of the Tanner graph. In this case, in the parity check matrix H, an element having a value of 1 may indicate that the message is exchanged between the check node and the variable node, and an element having a value of 0 may indicate that a message is not exchanged between the check node and the variable node.

On the right side of FIG. 2, a parity check matrix H' in which each element of the parity check matrix H on the left side is extended to a size of Z*Z may be identified (e.g., Z=4, etc.). In this case, the extended parity check matrix H' may be used in a quasi-cyclic (QC)-LDPC code used in communication systems, such as Wi-Fi, WiMax, and/or 5G systems, etc., but the example embodiment are not limited thereto.

Each element of the extended parity check matrix H' may be represented by a small square submatrix having a size $Z*Z$, and each submatrix may be, e.g., a cyclic-permutation matrix in which a $Z*Z$ unit matrix is cyclically shifted, but is not limited thereto. For example, in the extended parity check matrix H', an element having a value of 0 may indicate a $Z*Z$ unit matrix. In addition, in the extended parity check matrix H', an element having a value of 3 may indicate a cyclic-permutation matrix generated by cyclically shifting the $Z*Z$ unit matrix to the right three times. Also, in the extended parity check matrix H', an element having a value of −1 may indicate a $Z*Z$ zero matrix.

Hereinafter, for the sake of convenience of description and brevity, a parity check matrix having the same shape as the parity check matrix H shown on the left side of FIG. 2 is mainly described, and it is assumed that a calculation desired and/or required for the extended parity check matrix H' on the right side of FIG. 2 is implicitly performed, but the example embodiment are not limited thereto.

Figure 3:
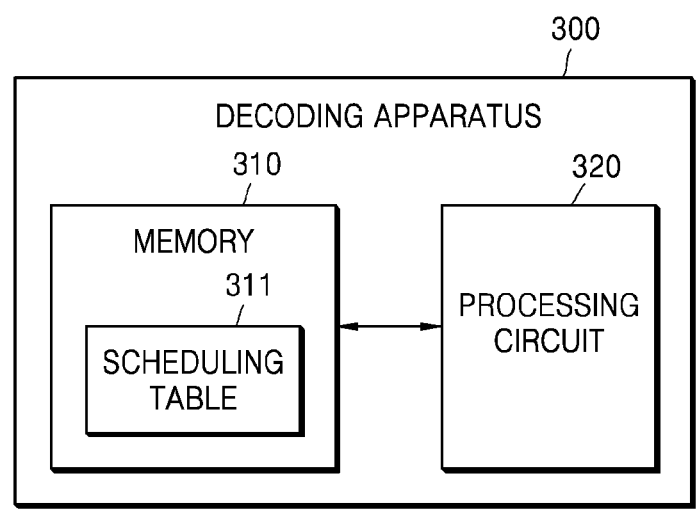
FIG. 3 is a diagram illustrating a decoding apparatus according to at least one example embodiment.

FIG. 3 is a diagram illustrating a decoding apparatus according to at least one example embodiment.

Referring to FIG. 3, the decoding apparatus 300 according to at least one example embodiment may include a memory 310 and/or a processing circuit 320 (e.g., processing circuitry, at least one processor, etc.), but the example embodiments are not limited thereto, and for example, the decoding apparatus 300 may include a greater or lesser number of constituent elements.

The memory 310 may store a scheduling table 311, etc., but is not limited thereto. The scheduling table 311 may be a table indicating a processing order of rows included in a parity check matrix and/or columns included in each row of the parity check matrix, etc. The scheduling table 311 may be referenced by the processing circuit 320, etc.

The processing order may include a row processing order, a column check node processing order, and/or a column variable node processing order, etc.

The row processing order may indicate an order in which processing on each row of the parity check matrix is performed and/or completed. The row processing order may be configured in consideration of and/or based on a weight assigned to each row included in the parity check matrix. In this case, the weight may be proportional to the number of columns that desire and/or require check node processing and/or variable node processing among columns included in a row included in the parity check matrix, but the example embodiments are not limited thereto. For example, the weight may indicate the number of elements having a value of 1 among elements included in each row of the parity check matrix, etc.

The row processing order according to at least one example embodiment may be configured such that a row having a relatively high weight (relative to the other rows of the matrix, e.g., the half of the rows of the matrix that have the highest weight, etc.) and a row having a relatively low weight (relative to the other rows of the matrix, e.g., the half of the rows of the matrix that have the lowest weight, etc.) are alternately processed, but is not limited thereto. At least one example embodiment in which the row processing order is configured based on the weight may be identified with reference to FIGS. 13 and 15 to be described below.

The column check node processing order may indicate an order of processing check nodes of columns included in one row of the parity check matrix. In addition, the column variable node processing order may indicate an order of processing variable nodes of columns included in at least one row of the parity check matrix.

The column check node processing order and the column variable node processing order may be configured such that, after the completion of variable node processing on a specific and/or desired column included in a first row of the parity check matrix to be processed first according to the row processing order, check node processing is performed on a specific and/or desired column included in a second row of the parity check matrix to be processed next (e.g., second, etc.) to the first row according to the row processing order. For example, the column check node processing order and the column variable node processing order may be configured such that, after variable node processing on a fifth column included in the first row of the parity check matrix is completed, check node processing is performed on a fifth column included in the second row, etc.

The processing circuit 320 may decode an LDPC code based on the scheduling table 311. The processing circuit 320 may decode the LDPC code by performing check node processing including a plurality of check node processing operations and/or variable node processing including a plurality of variable node processing operations, etc. In this case, the processing circuit 320 may perform check node processing and variable node processing based on the scheduling table 311 stored in the memory 310, but is not limited thereto. The processing circuit 320 may be implemented as hardware or a combination of hardware and software, etc. According to some example embodiments, the processing circuit 320 may be implemented as processing circuitry which may include hardware including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto. Further, according to some example embodiments, the processing circuitry may further include memory, such as the memory 310 and/or the posterior probability value memory 323, check-variable memory 324, and/or variable-check memory 327, etc.

Some example embodiments of the processing circuit 320 will be described in more detail with reference to FIGS. 4 to 6, and some example embodiments of the plurality of check node processing operations and the plurality of variable node processing operations will be described in more detail with reference to FIGS. 7 and 8.

Figure 4:
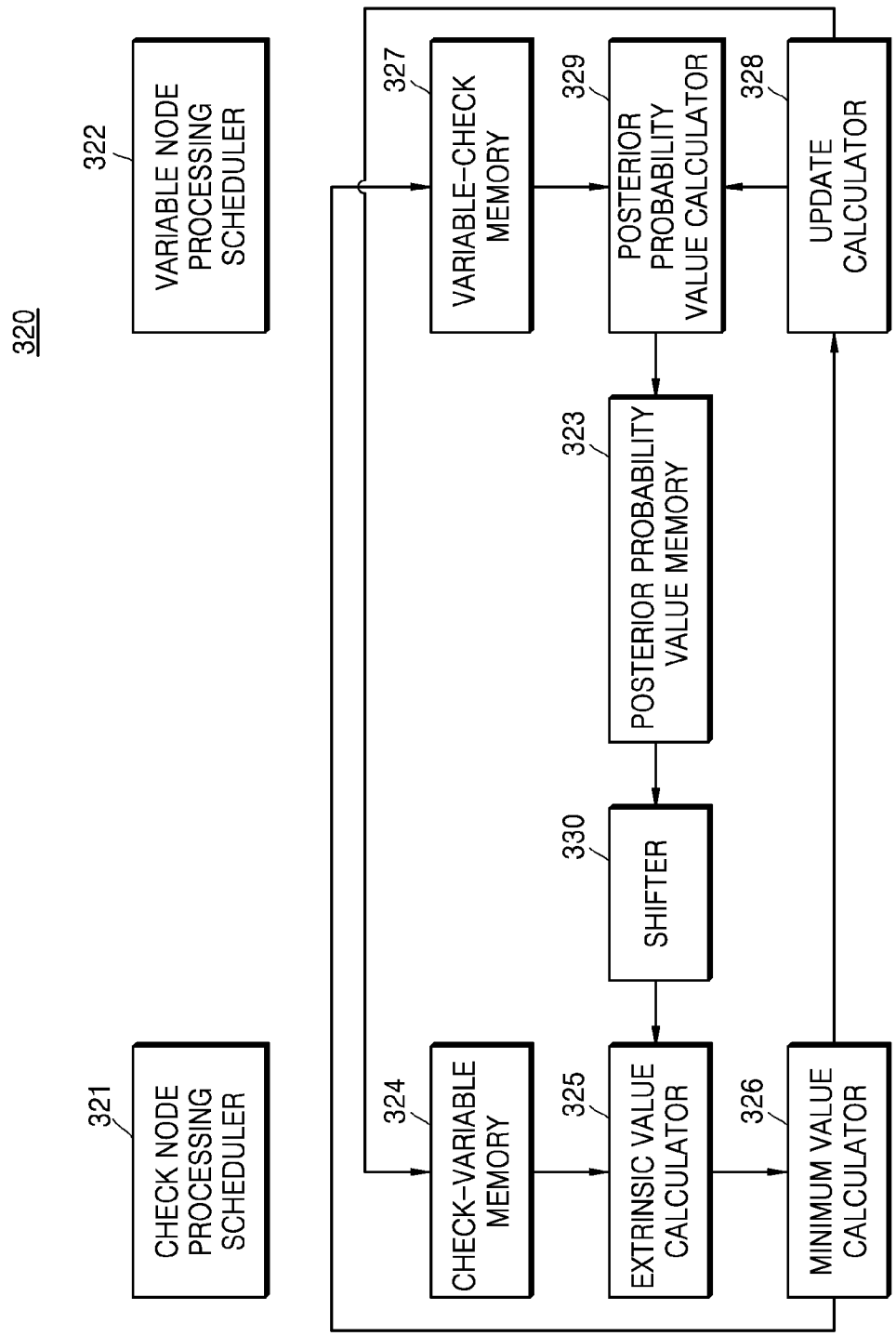
FIG. 4 is a diagram illustrating a detailed structure of a processing circuit, according to at least one example embodiment.

FIG. 4 is a diagram illustrating a detailed structure of a processing circuit, according to at least one example embodiment.

Referring to FIG. 4, the processing circuit 320 according to at least one example embodiment may include a check node processing scheduler 321, a variable node processing scheduler 322, a posterior probability value memory 323, a check-variable memory 324, an extrinsic value calculator 325, a minimum value calculator 326, a variable-check memory 327, an update calculator 328, and/or a posterior probability value calculator 329, etc., but is not limited thereto, and for example, may include a greater or lesser number of constituent elements. Also, the processing circuit 320 according to at least one example embodiment may further include a shifter 330, etc.

The check node processing scheduler 321 may control a plurality of check node processing operations to be sequentially performed based on a processing order (e.g., a desired processing order). The check node processing scheduler 321 may read the scheduling table 311 stored in the memory 310 and control a check node processing operation performed by other components of the processing circuit 320 and/or performed by the processing circuit 320 based on the scheduling table 311.

The variable node processing scheduler 322 may control the plurality of variable node processing operations to be sequentially performed based on the processing order. The variable node processing scheduler 322 may read the scheduling table 311 stored in the memory 310 and control a variable node processing operation performed by other components of the processing circuit 320 and/or performed by the processing circuit 320 based on the scheduling table 311.

The posterior probability value memory 323 may store a plurality of posterior probability values respectively corresponding to a plurality of variable nodes.

The posterior probability value memory 323 may store, for example, a log-likelihood ratio (LLR) value of an LDPC code generated by the reception apparatus 400, etc., as an initial posterior probability value, but is not limited thereto. In this case, the processing circuit 320 may determine that decoding is successful when a posterior probability value obtained by repeatedly performing check node processing and/or variable node processing by using the LLR value of the LDPC code satisfies a desired and/or preset condition. The posterior probability value memory 323 may store a posterior probability value changed during check node processing and/or variable node processing. In this case, a posterior probability value of a j-th variable node may be represented as $\Gamma_j$ (where j is an integer greater than or equal to 0).

The check-variable memory 324 may store a plurality of check-variable values transmitted from a plurality of check nodes to a plurality of variable nodes. In this case, a check-variable value transmitted from an i-th check node to the j-th variable node may be represented as $\alpha_{ij}$ (where i is an integer greater than or equal to 0).

In order to reduce memory capacity requirements and/or the amount of memory used, the check-variable memory 324 may store a check-variable value when an element of a parity check matrix is non-zero. That is, when a check node is not connected to a variable node, the check-variable memory 324 may not store a corresponding check-variable value.

According to another example embodiment, in order to reduce memory capacity requirements and/or the amount of memory used, instead of storing the check-variable value $\alpha_{ij}$, the check-variable memory 324 may store a sign of the check-variable value $\alpha_{ij}$, a first minimum value (e.g., a first desired value) that is the smallest value among the check-variable values ($\alpha_{ij}$ having the same value of i) transmitted from the same check node, and a second minimum value (e.g., a second desired value) that is the second smallest value among the check-variable values ($\alpha_{ij}$ having the same value of i) transmitted from the same check node, and a column index j of the first minimum value, but the example embodiments are not limited thereto. In this case, an output of the check-variable memory 324 may be transmitted to the extrinsic value calculator 325 through an operation, for example, to be performed by the update calculator 328, but the example embodiments are not limited thereto.

The extrinsic value calculator 325 may calculate a plurality of extrinsic values by subtracting the plurality of check-variable values from the plurality of posterior probability values, or in other words the extrinsic value calculator 325 may calculate the plurality of extrinsic values based on the plurality of check-variable values and the plurality of posterior probability values, etc.

The extrinsic value calculator 325 may read a posterior probability value from the posterior probability value memory 323. Also, the extrinsic value calculator 325 may read a check-variable value from the check-variable memory 324. In addition, the extrinsic value calculator 325 may calculate an extrinsic value by subtracting the check-variable value from the posterior probability value, or in other words, the extrinsic value calculator 325 may calculate an extrinsic value based on the check-variable value and the posterior probability value, etc.

According to at least one example embodiment, the extrinsic value calculator 325 may read a posterior probability value $\Gamma_j$ of the j-th variable node from the posterior probability value memory 323, read the check-variable value $\alpha_{ij}$ transmitted from the i-th check node to the j-th variable node from the check-variable memory 324, and/or calculate an extrinsic value $Q_{ij}$ corresponding to the i-th check node and the j-th variable node by subtracting the check-variable value $\alpha_{ij}$ from the posterior probability value $\Gamma_j$, etc., or in other words, the extrinsic value calculator 325 may calculate the extrinsic value $Q_{ij}$ corresponding to the i-th check node and the j-th variable node based on the check-variable value $\alpha_{ij}$ and the posterior probability value $\Gamma_j$. That is, the extrinsic value may be calculated by Equation 1 below.

$$Q_{ij} = \Gamma_j - \alpha_{ij} \qquad \text{[Equation 1]}$$

The minimum value calculator 326 may receive a calculation result from the extrinsic value calculator 325. In addition, the minimum value calculator 326 may calculate and/or determine a first minimum value and/or a second minimum value among the plurality of extrinsic values. For example, the minimum value calculator 326 may determine a first minimum value (e.g., a first desired value) by determining the smallest value among the plurality of extrinsic values, and the minimum value calculator 326 may determine a second minimum value (e.g., a second desired value) by determining the second smallest value among the plurality of extrinsic values, etc., but the example embodiments are not limited thereto, and for example, the minimum value calculator 326 may determine a single minimum value or three or more minimum values, etc.

The minimum value calculator 326 may calculate a first minimum value and/or a second minimum value for each row of the parity check matrix, but is not limited thereto. That is, the minimum value calculator 326 may calculate a first minimum value and a second minimum value among the plurality of extrinsic values for variable nodes connected to the same check node, etc.

The minimum value calculator 326 may include a plurality of buffers. In this case, each of the plurality of buffers may store the first minimum value and the second minimum value calculated for each row of the parity check matrix, but the example embodiments are not limited thereto. According to at least one example embodiment, the decoding apparatus 300 may decode the LDPC code by performing processing on a column included in a second row of the parity check matrix before processing on all columns included in a first row of the parity check matrix has been completed, or in other words, the decoding apparatus 300 may process the column in two or more rows of the parity check matrix concurrently and/or in parallel, etc. In this case, the minimum value calculator 326 may process the columns included in the second desired row while processing on the columns included in the first desired row is performed, but is not limited thereto, and for example, more than two rows may be concurrently processed and/or parallelly processed. In addition, the minimum value calculator 326 may temporarily store, in a first buffer of the plurality of buffers, a first minimum value and a second minimum value being calculated for a first row of the parity check matrix, and may store, in a second buffer of the plurality of buffers, a first minimum value and a second minimum value being calculated for a second row of the parity check matrix, etc. As described above, because the minimum value calculator 326 includes the plurality of buffers, the decoding apparatus 300 may decode the LDPC code by performing processing on the column included in the second row of the parity check matrix before processing on all columns included in the first row of the parity check matrix has been completed.

The first minimum value and the second minimum value calculated by the minimum value calculator 326 may be represented as Equations 2 and 3 below.

$$M1_i = \min_{j \in V(i)} |Q_{ij}| \quad \text{[Equation 2]}$$

$$M2_i = 2nd \min_{j \in V(i)} |Q_{ij}| \quad \text{[Equation 3]}$$

In addition, an index of a variable node having the first minimum value calculated by the minimum value calculator 326 may be represented as Equation 4 below.

$$M1_{index} = \arg \min_{j \in V(i)} |Q_{ij}| \quad \text{[Equation 4]}$$

According to at least one example embodiment, the minimum value calculator 326 may calculate the first minimum value and the second minimum value by applying an offset min sum (OMS) method, but the example embodiments are not limited thereto. In this case, when c is applied as an offset value, the minimum value calculator 326 may calculate the first minimum value by using Equation 5 below and calculate the second minimum value by using Equation 6 below.

$$M1_i = \max\left(\min_{j \in V(i)} |Q_{ij}| - \varepsilon, 0\right) \quad \text{[Equation 5]}$$

$$M2_i = \max\left(2nd \min_{j \in V(i)} |Q_{ij}| - \varepsilon, 0\right) \quad \text{[Equation 6]}$$

According to another example embodiment, the minimum value calculator 326 may calculate the first minimum value and the second minimum value by applying a scaled min sum (SMS) method, but the example embodiments are not limited thereto. In this case, when s is used as a scale value, the minimum value calculator 326 may calculate the first minimum value by using Equation 7 below and calculate the second minimum value by using Equation 8 below.

$$M1_i = s \cdot \min_{j \in V(i)} |Q_{ij}| \quad \text{[Equation 7]}$$

$$M2_i = s \cdot 2nd \min_{j \in V(i)} |Q_{ij}| \quad \text{[Equation 8]}$$

According to another example embodiment, the minimum value calculator 326 may calculate the first minimum value and the second minimum value by applying both the OMS method and the SMS method, but the example embodiments are not limited thereto. In this case, when c is applied as an offset value and s is applied as a scale value, the minimum value calculator 326 may calculate the first minimum value by using Equation 9 below and calculate the second minimum value by using Equation 10 below.

$$M1_i = \max\left(s \cdot \min_{j \in V(i)} |Q_{ij}| - \varepsilon, 0\right) \quad \text{[Equation 9]}$$

$$M2_i = \max\left(s \cdot 2nd \min_{j \in V(i)} |Q_{ij}| - \varepsilon, 0\right) \quad \text{[Equation 10]}$$

The variable-check memory 327 may store the plurality of extrinsic values. The variable-check memory 327 may receive and store the plurality of extrinsic values calculated by the extrinsic value calculator 325.

The update calculator 328 may receive the first minimum value and/or the second minimum value, e.g., a plurality of minimum values, from the minimum value calculator 326, etc. The update calculator 328 may recalculate a plurality of check-variable values based on the first minimum value and the second minimum value (e.g., recalculate the plurality of check-variable values based on the plurality of minimum values), etc. In this case, a check-variable value may be recalculated using Equations 11 to 14 below.

$$\alpha'_{ij} = \delta_{ij} \cdot \min_{j' \in V(i) \setminus j} |Q_{ij'}| \quad \text{[Equation 11]}$$

$$\delta_{ij} = \frac{\lambda_i}{\text{sign}(Q_{ij})} \quad \text{[Equation 12]}$$

$$\lambda_i = \prod_{j' \in V(i)} \text{sign}(Q_{ij'}) \quad \text{[Equation 13]}$$

$$\min_{j' \in V(i) \setminus j} |Q_{ij'}| = \begin{cases} M2_i & \text{if } j = M1_{index} \\ M1_i & \text{otherwise} \end{cases} \quad \text{[Equation 14]}$$

In addition, the plurality of check-variable values recalculated by the update calculator 328 may be updated and stored in the check-variable memory 324.

The posterior probability value calculator 329 may recalculate a plurality of posterior probability values by summing the plurality of extrinsic values and the plurality of recalculated check-variable values, or in other words, the posterior probability value calculator 329 may recalculate a plurality of posterior probability values based on the plurality of extrinsic values and the plurality of recalculated check-variable values, but the example embodiments are not limited thereto.

The posterior probability value calculator 329 may read an extrinsic value from the variable-check memory 327. Also, the posterior probability value calculator 329 may read a recalculated check-variable value from the update calculator 328. In addition, the posterior probability value calculator 329 may recalculate a posterior probability value by summing the extrinsic value and the recalculated check-variable value, or in other words, the posterior probability value calculator 329 may recalculate a posterior probability value based on the extrinsic value and the recalculated check-variable value, etc.

According to at least one example embodiment, the posterior probability value calculator 329 may read an extrinsic value $Q_{ij}$ corresponding to the i-th check node and the j-th variable node from the variable-check memory 327, read a check-variable value $\alpha'_{ij}$ corresponding to the i-th check node and the j-th variable node from the update calculator 328, and recalculate a posterior probability value $\Gamma'_j$ of the j-th variable node by summing the extrinsic value $Q_{ij}$ and the recalculated check-variable value $\alpha'_{ij}$. In other words, the posterior probability value calculator 329 may recalculate a posterior probability value $\Gamma'_j$ of the j-th variable node based on the extrinsic value $Q_{ij}$ and the recalculated check-variable value $\alpha'_{ij}$. That is, the recalculated posterior probability value $\Gamma'_j$ may be as in Equation 15 below.

$$\Gamma'_j = Q_{ij} + \alpha'_{ij} \quad \text{[Equation 15]}$$

In addition, the plurality of posterior probability values recalculated by the posterior probability value calculator 329 may be updated and stored in the posterior probability value memory 323.

The shifter 330 may shift the posterior probability value stored in the posterior probability value memory 323 and output the posterior probability value to the extrinsic value calculator 325. The shifter 330 is a component desired and/or required for block-by-block decoding of the LDPC code, and may be omitted when block-by-block decoding is not desired and/or unnecessary, etc.

Figure 5:
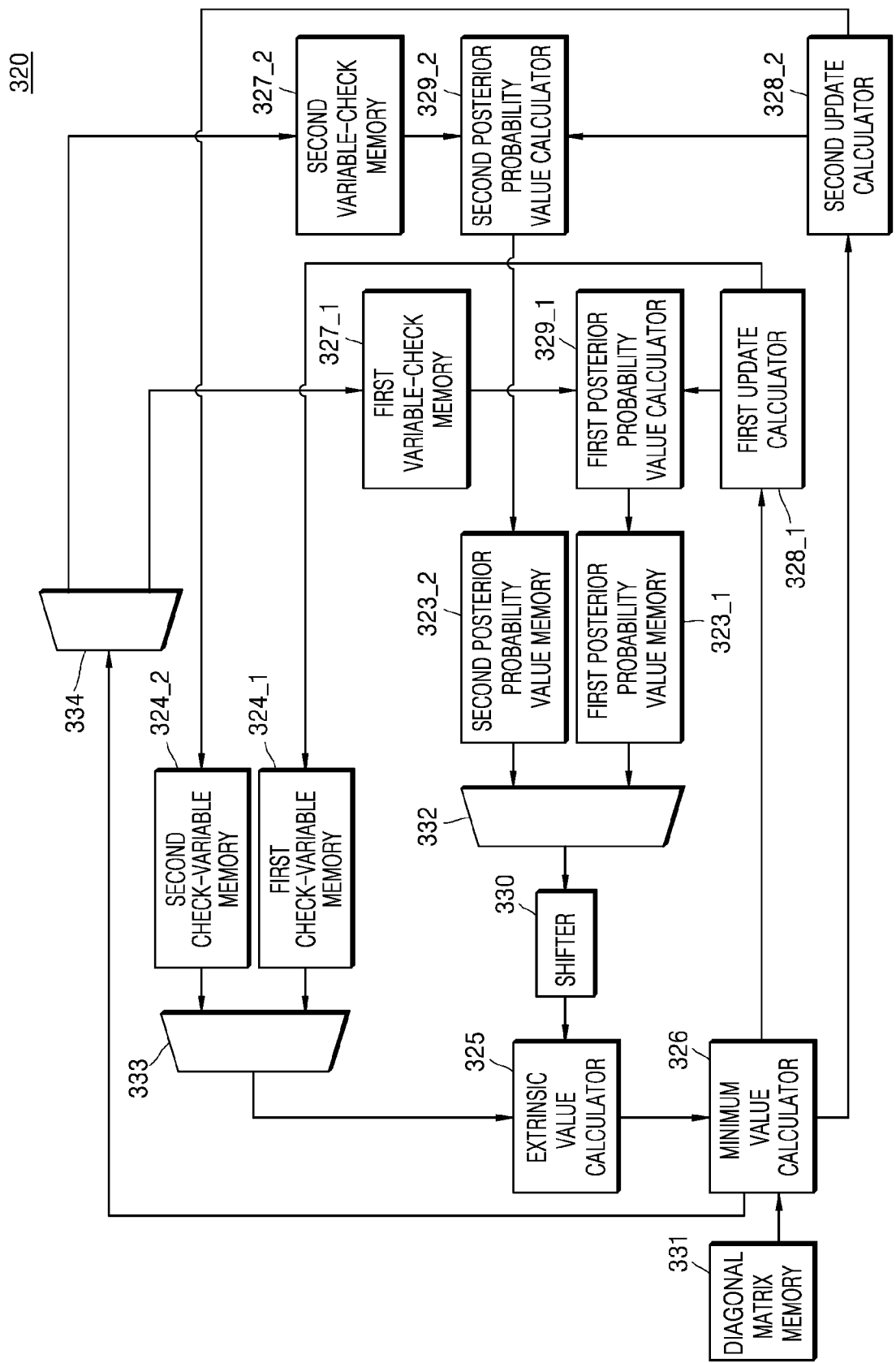
FIG. 5 is a diagram illustrating a detailed structure of a processing circuit, according to at least one example embodiment.

FIG. 5 is a diagram illustrating a detailed structure of a processing circuit, according to at least one example embodiment.

Referring to FIG. 5, at least one example embodiment of the processing circuit 320 may be identified. In this case, unlike FIG. 4, although the check node processing scheduler 321 and the variable node processing scheduler 322 are not shown in FIG. 5, at least one example embodiment of FIG. 5 may also include the check node processing scheduler 321 and/or the variable node processing scheduler 322, etc. Because the structure and operation of the processing circuit 320 of FIG. 5 are similar to those shown in FIG. 4, differences will be mainly described below.

A posterior probability value memory may include a first posterior probability value memory 323_1 and/or a second posterior probability value memory 323_2, but the example embodiments are not limited thereto, and the posterior probability value memory may have a greater or lesser number of sub-memories and/or sub-memory regions, etc. The first posterior probability value memory 323_1 may store a plurality of first posterior probability values respectively corresponding to variable nodes that do not correspond to a puncturing area and/or a diagonal matrix area of a parity check matrix, but is not limited thereto. In addition, the second posterior probability value memory 323_2 may store a plurality of second posterior probability values respectively corresponding to variable nodes that correspond to the puncturing area and/or the diagonal matrix area of the parity check matrix, but is not limited thereto. The puncturing area of the parity check matrix refers to one or more columns of the parity check matrix which correspond to and/or include entries (e.g., parity bits) which have been removed from the parity check matrix. The diagonal matrix area of the parity check matrix corresponds to a diagonal area of the matrix in which the entries outside the diagonal are all zero. A detailed illustration of the puncturing area and the diagonal matrix area is given below with reference to FIG. 9.

Among the plurality of second posterior probability values stored in the second posterior probability value memory 323_2, a plurality of second posterior probability values corresponding to the diagonal matrix area may be stored in the same storage space. This is because the plurality of second posterior probability values corresponding to the diagonal matrix area do not change the extrinsic value and only need to maintain the posterior probability value before being hard-decided and output, etc.

The second posterior probability value memory 323_2 may include at least one flip-flop, etc., but is not limited thereto. Because the number of variable nodes corresponding to the puncturing area of the parity check matrix is a prime number, and a plurality of second posterior probability values respectively corresponding to variable nodes that correspond to the diagonal matrix area may be shared and stored, the second posterior probability value memory 323_2 may store a small number of values. Accordingly, the second posterior probability value memory 323_2 stores the plurality of second posterior probability values through the flip-flop, such that a delay occurring in reading and/or writing of a second posterior probability value may be significantly reduced.

In this case, only one of a first posterior probability value stored in the first posterior probability value memory 323_1 and a second posterior probability value stored in the second posterior probability value memory 323_2 may be output to the shifter 330 through a first multiplexer (MUX) 332, but the example embodiments are not limited thereto. The first MUX 332 may output one of the first posterior probability value and the second posterior probability value based on a signal (e.g., control signal, etc.) received from the check node processing scheduler 321. The check node processing scheduler 321 may output the second posterior probability value in response to check node processing and/or variable node processing corresponding to the puncturing area and/or the diagonal matrix area of the parity check matrix based on a scheduling table is desired and/or required, and may output the first posterior probability value in response to check node processing and/or variable node processing that does not correspond to the puncturing area and/or the diagonal matrix area of the parity check matrix is desired and/or required.

An update calculator may include, for example, a first update calculator 328_1 and a second update calculator 328_2, etc., but is not limited thereto, and for example, may include a greater or lesser number of update calculators, etc. The first update calculator 328_1 may recalculate a plurality of first check-variable values respectively corresponding to the plurality of first posterior probability values. In addition, the second update calculator 328_2 may recalculate a plurality of second check-variable values respectively to the plurality of second posterior probability values.

A check-variable memory may include, for example, a first check-variable memory 324_1 and a second check-variable memory 324_2, but is not limited thereto, and for example, may include a greater or lesser number of check-variable memories, etc. The first check-variable memory 324_1 may store a plurality of first check-variable values. The second check-variable memory 324_2 may store a plurality of second check-variable values.

In this case, only one of a first check-variable value stored in the first check-variable memory 324_1 and a second check-variable value stored in the second check-variable memory 324_2 may be output to the extrinsic value calculator 325 through a second MUX 333, but the example embodiments are not limited thereto. The second MUX 333 may output one of the first check-variable value and the second check-variable value based on a signal received from the check node processing scheduler 321. The check node processing scheduler 321 may output the second check-variable value when check node processing and/or variable node processing corresponding to the puncturing area and/or the diagonal matrix area of the parity check matrix based on a scheduling table is desired and/or required, and may output the first check-variable value when check node processing and/or variable node processing that does not correspond to the puncturing area and/or the diagonal matrix area of the parity check matrix is desired and/or required.

A variable-check memory may include a first variable-check memory 327_1 and a second variable-check memory 327_2, but is not limited thereto, and for example, may include a greater or lesser number of variable-check memories, etc. The first variable-check memory 327_1 may store a plurality of first extrinsic values calculated based on the plurality of first posterior probability values, etc. In addition, the second variable-check memory 327_2 may store a plurality of second extrinsic values calculated based on the plurality of second posterior probability values, etc.

In this case, among a plurality of extrinsic values calculated by the extrinsic value calculator 325, a first extrinsic value may be transmitted to the first variable-check memory 327_1 through a demultiplexer (DEMUX) 334, and a second extrinsic value may be transmitted to the second variable-check memory 327_2 through the DEMUX 334, etc. The DEMUX 334 may transmit the first extrinsic value or the second extrinsic value to the first variable-check memory 327_1 and/or the second variable-check memory 327_2 based on a signal (e.g., control signal, etc.) received from the check node processing scheduler 321. The check node processing scheduler 321 may transmit, when a second extrinsic value corresponding to the puncturing area and/or the diagonal matrix area of the parity check matrix based on the scheduling table is calculated, the second extrinsic value to the second variable-check memory 327_1, and may transmit, when a first extrinsic value that does not correspond to the puncturing area and/or the diagonal matrix area of the parity check matrix is calculated, the first extrinsic value to the first variable-check memory 327_1.

A posterior probability value calculator may include for example, a first posterior probability value calculator 329_1 and a second posterior probability value calculator 329_2, but is not limited thereto, and for example, may include a greater or lesser number of posterior probability value calculators, etc. The first posterior probability value calculator 329_1 may recalculate the plurality of first posterior probability values by summing the plurality of first extrinsic values and the plurality of first check-variable values, etc. In addition, the second posterior probability value calculator 329_2 may recalculate the plurality of second posterior probability values by summing the plurality of second extrinsic values and the plurality of second check-variable values, etc.

The processing circuit 320 may further include a diagonal matrix memory 331. The diagonal matrix memory 331 may store a plurality of initial posterior probability values corresponding to the diagonal matrix area of the parity check matrix. The diagonal matrix area of the parity check matrix corresponds to a diagonal area of the matrix in which the entries outside the diagonal are all zero. Due to the characteristics of the parity check matrix, a variable node corresponding to the diagonal matrix area is connected to one check node. Accordingly, an extrinsic value corresponding to a variable node that corresponds to the diagonal matrix area of the parity check matrix has the same value as an initial posterior probability value. Therefore, by directly connecting the diagonal matrix memory 331 to the minimum value calculator 326, the diagonal matrix memory 331 stores the plurality of initial posterior probability values corresponding to the diagonal matrix area of the parity check matrix, and a part of the variable node processing operation corresponding to a diagonal matrix may be omitted.

As described above, the processing circuit 320 according to at least one example embodiment may perform variable node processing on variable nodes that do not correspond to the puncturing area and/or the diagonal matrix area of the parity check matrix through the first posterior probability value memory 323_1, the first check-variable memory 324_1, the first variable-check memory 327_1, the first update calculator 328_1, and/or the first posterior probability value calculator 329_1, etc., and may perform variable node processing on variable nodes corresponding to the puncturing area and/or the diagonal matrix area of the parity check matrix through the second posterior probability value memory 323_2, the second check-variable memory 324_2, the second variable-check memory 327_2, the second update calculator 328_2, and/or the second posterior probability value calculator 329_2, etc. In addition, the initial posterior probability value may be directly transmitted to the minimum value calculator 326 through the diagonal matrix memory 331. As described above, by performing variable node processing corresponding to the puncturing area and/or the diagonal matrix area of the parity check matrix through a separate memory and calculator and using the diagonal matrix memory 331, the time required for decoding of the entire LDPC code may be reduced.

Figure 6:
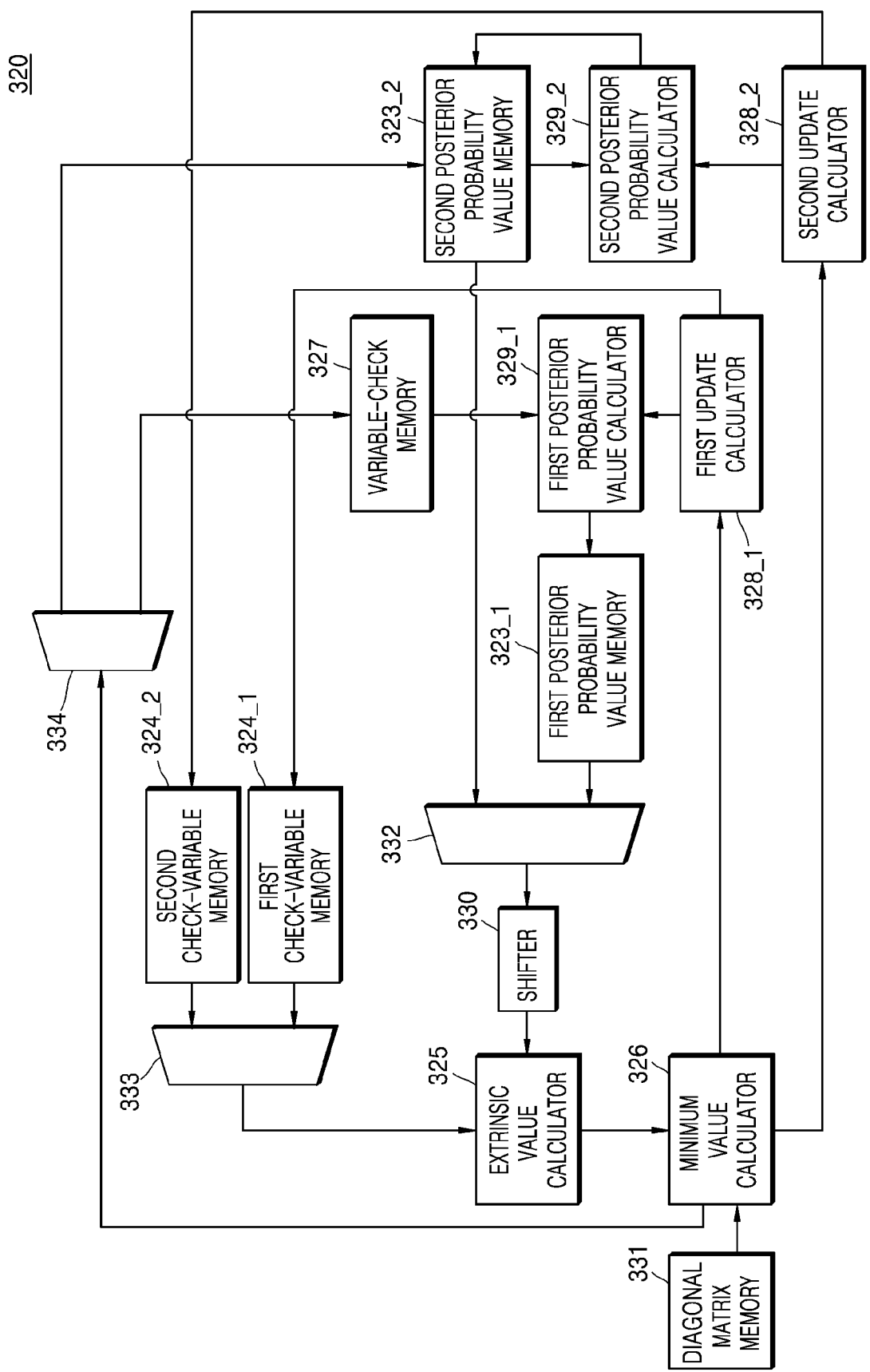
FIG. 6 is a diagram illustrating a detailed structure of a processing circuit, according to at least one example embodiment.

FIG. 6 is a diagram illustrating a detailed structure of the processing circuit, according to at least one example embodiment.

Referring to FIG. 6, at least one example embodiment of the processing circuit 320 may be identified. In this case, unlike FIG. 4, although the check node processing scheduler 321 and the variable node processing scheduler 322 are not shown in FIG. 6, at least one example embodiment of FIG. 6 may also include the check node processing scheduler 321 and/or the variable node processing scheduler 322, but is not limited thereto. Because the structure and operation of the processing circuit 320 of FIG. 6 are similar to those shown in FIG. 4, differences are mainly described.

Unlike the processing circuit 320 of FIG. 5, the processing circuit 320 of FIG. 6 may include one variable-check memory 327, and the variable-check memory 327 may store a plurality of first extrinsic values calculated based on a plurality of first posterior probability values. In addition, a plurality of second extrinsic values calculated by the extrinsic value calculator 325 may be transmitted to the second posterior probability value memory 323_2. Accordingly, the reason that the second posterior probability value memory 323_2 may also be used as a memory storing the plurality of second extrinsic values is that, as described above, the second posterior probability value memory 323_2 is implemented as a flip-flop and thus may independently and/or simultaneously read from and write to each storage space corresponding to a variable node, and the flip-flop has less time delay in comparison to other memory devices.

The plurality of second extrinsic values received by the second posterior probability value memory 323_2 may be input to the second posterior probability value calculator 329_2 and may be used to calculate a second posterior probability value. That is, the second posterior probability value calculator 329_2 may recalculate a plurality of second posterior probability values by summing a plurality of initial posterior probability values and a plurality of second check-variable values, or in other words, the second posterior probability value calculator 329_2 may recalculate a plurality of second posterior probability values based on the plurality of initial posterior probability values and the plurality of second check-variable values, etc. In this case, an extrinsic value corresponding to a recalculated second posterior probability value stored in the second posterior probability value memory 323_2 may be updated with the recalculated second posterior probability value.

Figure 7:
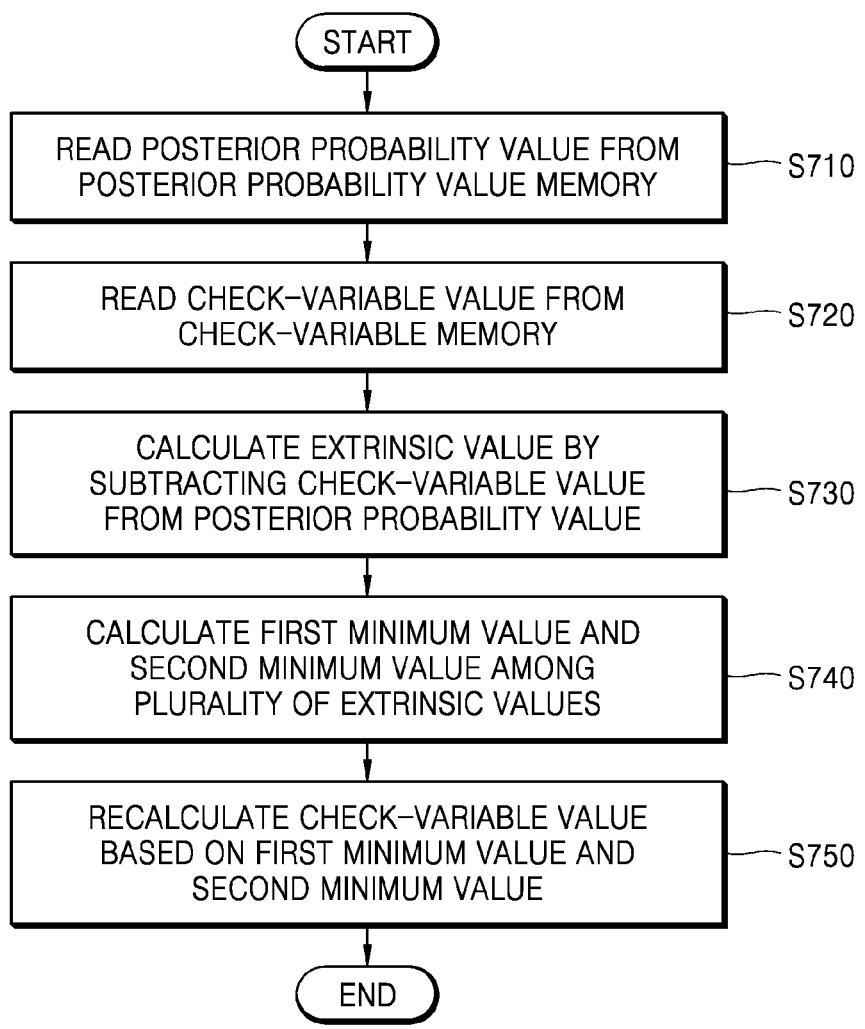
FIG. 7 is a flowchart illustrating check node processing operations performed by a decoding apparatus, according to at least one example embodiment.

FIG. 7 is a flowchart illustrating a check node processing operation performed by the decoding apparatus, according to at least one example embodiment.

Referring to FIG. 7, first, in operation S710, a processing circuit may read a posterior probability value from a posterior probability value memory. The posterior probability value read from the posterior probability value memory may be input to a shifter, but the example embodiments are not limited thereto.

In operation S720, the processing circuit may read a check-variable value from a check-variable memory. The check-variable value read from the check-variable memory may be input to an extrinsic value calculator. Also, in operation S720, the posterior probability value may be shifted and input to the extrinsic value calculator, but the example embodiments are not limited thereto.

In operation S730, the processing circuit may calculate an extrinsic value based on the check-variable value and the posterior probability value, etc. For example, the processing circuit may calculate the extrinsic value by subtracting the check-variable value from the posterior probability value using the extrinsic value calculator, etc.

In operation S740, the processing circuit may calculate and/or determine a plurality of minimum values, e.g., a first minimum value and a second minimum value, etc., among a plurality of extrinsic values for variable nodes connected to the same check node. In addition, the extrinsic value calculated in operation S730 may be stored in the variable-check memory in operation S740.

In operation S750, the processing circuit may recalculate the check-variable value based on the determined plurality of minimum values, e.g., the first minimum value and the second minimum value, etc.

Operations S710 to S750 as described above may be controlled to be processed by other components of the processing circuit through a check node processing scheduler, but the example embodiments are not limited thereto. In this case, the check node processing scheduler may cause each of operations S710 to S750 to be processed by other components of the processing circuit by using a pipelined manner, but is not limited thereto. In addition, each of operations S710 to S750 may be processed in one clock cycle, but is not limited thereto.

Figure 8:
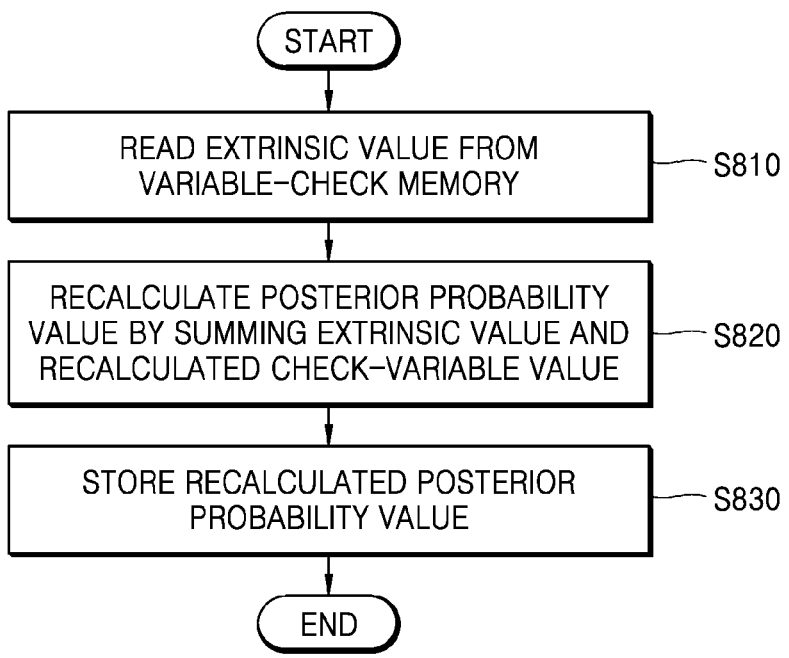
FIG. 8 is a flowchart illustrating variable node processing operations performed by a decoding apparatus, according to at least one example embodiment.

FIG. 8 is a flowchart illustrating a variable node processing operation performed by the decoding apparatus, according to at least one example embodiment.

Referring to FIG. 8, first, in operation S810, a processing circuit may read an extrinsic value from a variable-check memory. The extrinsic value read from the variable-check memory may be input to a posterior probability value calculator, but is not limited thereto.

In operation S820, the processing circuit may read the extrinsic value and a check-variable value recalculated by an update calculator. The recalculated check-variable value may be input to the posterior probability value calculator. Also, in operation S820, the posterior probability value calculator may recalculate the posterior probability value based on the input extrinsic value and the recalculated check-variable value, e.g., by summing the input extrinsic value and the recalculated check-variable value.

In operation S830, the processing circuit may update and store the recalculated posterior probability value in the posterior probability value memory, but the example embodiments are not limited thereto.

According to some example embodiments, the components of the processing circuit may be controlled by a variable node processing scheduler to perform operations S810 to S830, but the example embodiments are not limited thereto. In this case, the variable node processing scheduler may cause each of operations S810 to S830 to be processed by other components of the processing circuit in a pipelined manner, but the example embodiments are not limited thereto. In addition, each of operations S810 to S830 may be processed in one clock cycle, but are not limited thereto.

Figure 9:
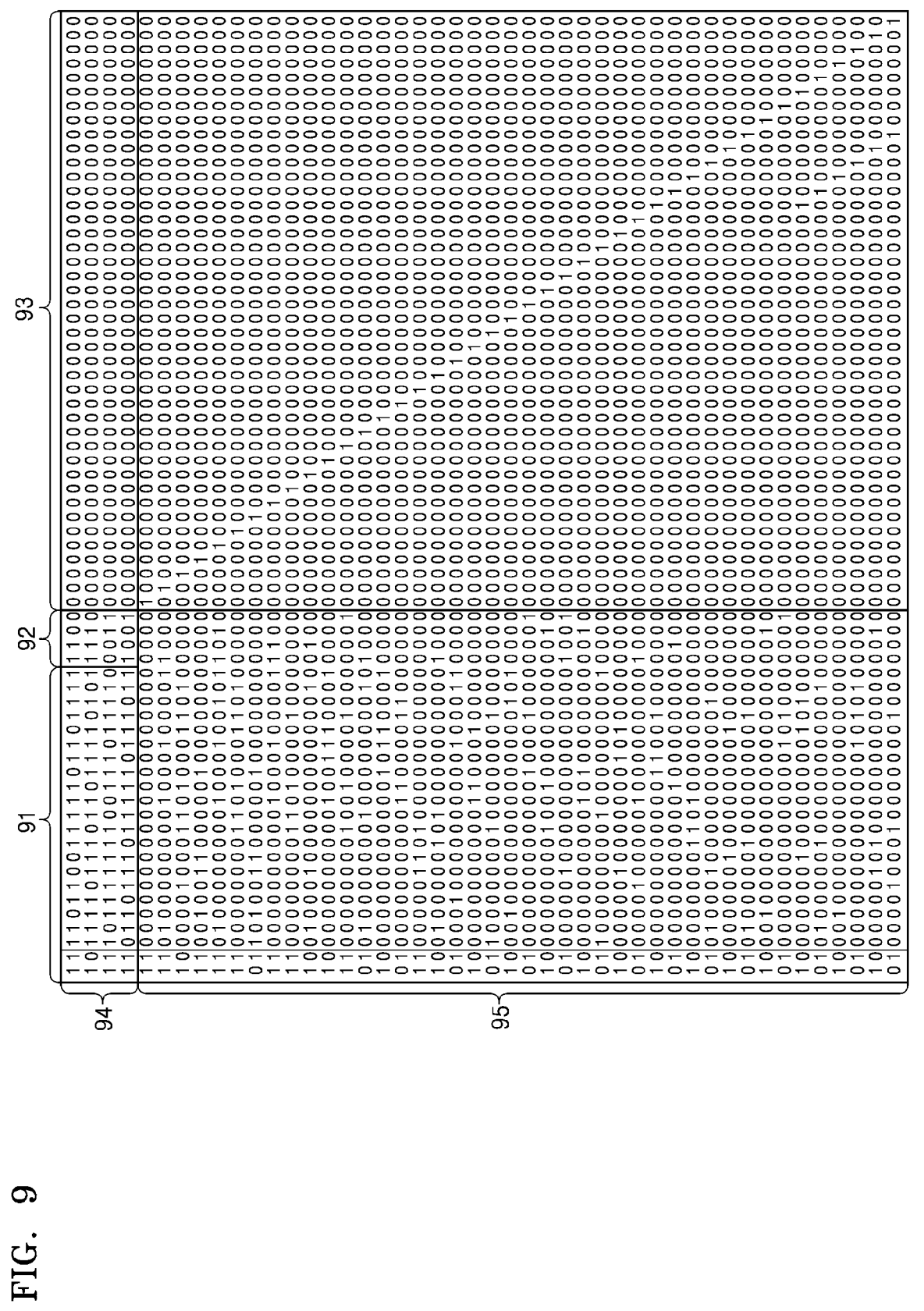

FIG. 9 is a diagram illustrating an example of a parity check matrix used in a 5G communication system according to some example embodiments.

Referring to FIG. 9, an example of the parity check matrix that may be used in the 5G communication system may be identified. In this case, the parity check matrix may include a total of 46 rows and 68 columns, but the example embodiments are not limited thereto. In this case, the sixty eight (68) columns may include twenty two (22) information columns 91, four (4) core parity columns 92, and forty two (42) extended parity columns 93 from the left. In addition, the forty six (46) rows may include four (4) core check rows 94 and forty two (42) extended check rows 95 from the top. The parity check matrix may be divided into a plurality of areas as shown in FIG. 10, but is not limited thereto.

Figure 10:
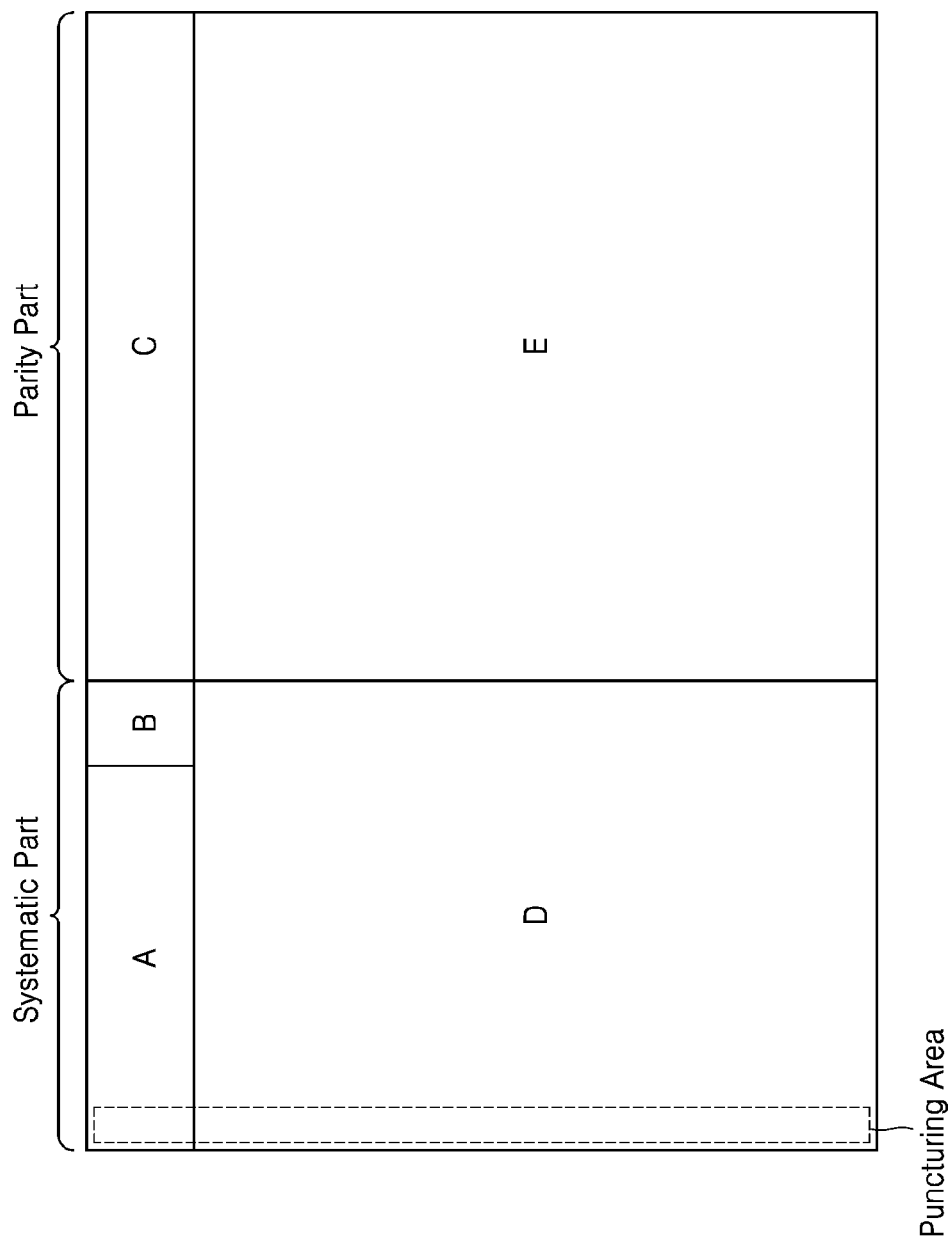
FIG. 10 is a diagram for describing a structure of the parity check matrix of FIG. 9 according to some example embodiments.

FIG. 10 is a diagram for describing a structure of the parity check matrix of FIG. 9 according to some example embodiments.

Referring to FIG. 10, the parity check matrix may be divided into a total of 5 areas, but the example embodiments are not limited thereto. First, an area A may be an area including twenty two (22) information columns 91 and four (4) core check rows 94. In addition, an area B may be an area including four (4) core parity columns 92 and four (4) core check rows 94. In this case, when only the areas A and B are used, the highest coding rate may be obtained, but the example embodiments are not limited thereto.

An area C may be an area including forty two (42) extended parity columns 93 and four (4) core check rows 94. The area C may be a zero matrix in which all elements are 0, but the example embodiments are not limited thereto.

An area D may be an area including twenty two (22) information columns 91, four (4) core parity columns 92, and forty two (42) extended check rows 95. In addition, an area E may be an area include forty two (42) extended parity columns 93 and forty two (42) extended check rows 95. The area E may be a 42*42 unit matrix, but is not limited thereto. In this case, when only the areas D and E are used, a low coding rate may be obtained.

In this regard, two left columns of the areas A and D may be a puncturing area, but the example embodiments are not limited thereto. That is, the two left columns of the areas A and D may be columns corresponding to and/or including bits punctured (e.g., removed parity bits) and transmitted in a codeword encoded with an LDPC code. In other words, an original codeword may be "punctured" by removing parity bits corresponding to and/or included in the puncturing areas A and/or D of the parity check matrix to further increase the coding rate of the code word, etc.

In FIGS. 11 to 16, some example embodiments of a processing order of the decoding apparatus for an LDPC code encoded based on the parity check matrix as shown in FIG. 9 and a scheduling table indicating the processing order may be identified. In the following description, rows of the parity check matrix may be represented by row indices 0 to 45 in order from the top row, and columns of the parity check matrix may be represented by column indices 0 to 67 in order from the leftmost column, however the example embodiments are not limited thereto, and there may be a greater or lesser number of rows and/or columns in the parity check matrix.

FIGS. 11A and 11B are diagrams illustrating an example of an order of performing check node processing and variable node processing by the decoding apparatus, according to at least one comparative example embodiment.

Referring to FIG. 11A, a processing order of check node processing operations for decoding of an LDPC code having a coding rate of, e.g., 22/28 by the decoding apparatus according to the comparative example may be identified, but the example embodiments are not limited thereto, and for example, a different coding rate for the LDPC code may be used. In this case, a row processing order of the check node processing operations is described as a row index in the leftmost column of the table. In the comparative example embodiment of FIG. 11A, the row processing order may be 0, 1, 2, 3, 4, and 5 as a row index.

In addition, a column check node processing order for columns corresponding to each row index is shown on the right side of the row index. In at least one example embodiment of FIG. 11A, the column check node processing order for columns included in a row having a row index of 0 may be 2, 5, 6, 9, 10, . . . as a column index, and the column check node processing order for columns included in a row having a row index of 4 may be 26, 0, and 1 as a column index, etc.

Referring to FIG. 11B, a processing order of variable node processing operations for decoding of an LDPC code having a coding rate of, e.g., 22/28 by the decoding apparatus according to the comparative example may be identified, but the example embodiments are not limited thereto, and for example, a different coding rate for the LDPC code may be used. In this case, a row processing order of the variable node processing operations is described as a row index in the leftmost column of the table. In the comparative example embodiment of FIG. 11B, the row processing order may be 0, 1, 2, 3, 4, and 5 as a row index, and this may be the same as the row processing order of the check node processing operations shown in FIG. 11A.

In addition, a column variable node processing order for columns corresponding to each row index is shown on the right side of the row index. In the comparative example embodiment of FIG. 11B, the column check node processing order for columns included in a row having a row index of 0 may be 0, 2, 3, 5, 9, . . . as a column index, and the column check node processing order for columns included in a row having a row index of 4 may be 0, 1, and 26 as a column index. In this case, as shown in FIGS. 11A and 11B, a column check node processing order and a column variable node processing order for the same row index may be different from each other, but the example embodiments are not limited thereto.

FIGS. 12A to 12D are diagrams illustrating an example of a scheduling table used by the decoding apparatus according to at least one comparative example embodiment.

Referring to FIGS. 12A to 12D, a scheduling table generated according to the processing order as shown in FIGS. 11A and 11B may be identified, but the example embodiments are not limited thereto.

The top row in the scheduling table indicates a clock sequence number, but the example embodiments are not limited thereto. In addition, in the leftmost column, numbers of check node processing operations and variable node processing operations are shown. In this case, operations R1 to R5 may respectively correspond to operations S710 to S750, which are check node processing operations shown in FIG. 7, and operations W1 to W3 may respectively correspond to operations S810 to S830, which are variable node processing operations shown in FIG. 8, however, the example embodiments are not limited thereto.

In this case, operation R1, which is scheduled to be performed first among the check node processing operations, may start during a first clock cycle and may be performed according to and/or based on the processing order of FIG. 11A, but is not limited thereto. In addition, operation R2, which is scheduled to be performed second among the check node processing operations, may start during a second clock cycle, and operations R3 to R5, etc., may also sequentially start in a pipelined manner, but the example embodiments are not limited thereto.

Furthermore, operation W1, which is scheduled to be performed first among the variable node processing operations, may start during a clock cycle in which operation R5 for a row index on which variable node processing is scheduled to be performed and/or completed. For example, operation W1 for a row having a row index of 0 may start during a twenty-third clock cycle in which operation R5 for a row having a row index of 0 is performed last. In other words, the variable node processing operation W1 for row 0 starts during the same clock cycle that a check node processing for row 0 is completed.

Figure 12B:
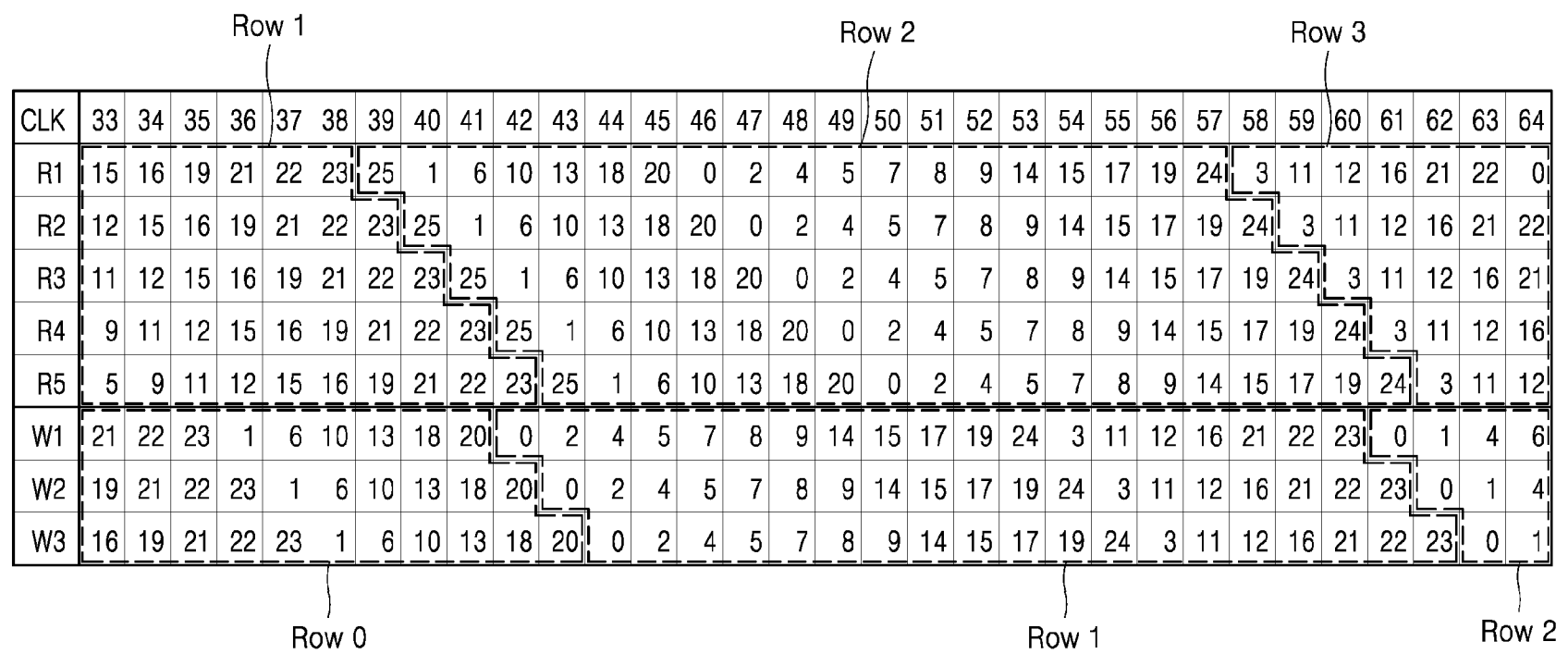

In the aforementioned manner, in FIGS. 12A and 12B, a check node processing operation for rows having row indices of, e.g., 0 to 2 (e.g., 0, 1, 2, etc.) may be completed, and a variable node processing operation for columns having column indices of, e.g., 0 and 1, may be completed, etc. In addition, referring to FIG. 12C, it may be identified that, after a check node processing operation for a row having a row index of 3 is completed, when a check node processing operation is performed on a row having a row index of 4, a stall occurs in the middle of the operations. In at least one example embodiment of FIG. 12C, in the case of operation R1, it may be identified that a stall occurs in a seventy-eighth clock cycle to an eighty-second clock cycle, etc. In addition, in the case of operation R2, it may be identified that a stall occurs in a seventy-ninth clock cycle to an eighty-third clock cycle. Also, due to the characteristics of a pipelined method, even in operations R3, R4, and R5, it may be identified that stalls having the same length propagate with a one-clock cycle delay, compared to a previous processing operation.

Such stalls may have occurred because, after variable node processing on specific columns included in a first row of the parity check matrix to be processed first according to the row processing order is completed, check node processing may be performed on specific columns included in a second row of the parity check matrix to be processed next to the first row according to the row processing order. In at least one example embodiment of FIG. 12C, this is because, after all of the variable node processing operations for a column having a column index of 0 in a row having a row index of 3, on which processing needs to be performed first, are finished, a check node processing operation for a column having a column index of 0 in a row having a row index of 4, on which processing needs to be performed next to the row having a row index of 3, may start. Accordingly, operation R1 for the column having a column index of 0 in the row having a row index of 4 may be performed during an eighty-third clock cycle, which follows an eighty-second clock cycle in which operation W3 for the column having a column index of 0 in the row having a row index of 3 is performed.

Similarly, in FIGS. 12C and 12D, it may be identified that a stall occurs when a check node processing operation and a variable node processing operation are performed on a row having a row index of 5.

As described above, in the decoding apparatus according to the comparative example, it may be identified that a stall occurs in the middle of the check node processing operation and the variable node processing operation, and thus, decoding of the LDPC code is delayed.

FIGS. 13A and 13B are diagrams illustrating an example of an order of performing check node processing and variable node processing by the decoding apparatus, according to at least one example embodiment.

Referring to FIG. 13A, a processing order of check node processing operations for decoding of an LDPC code having a coding rate of, e.g., 22/28 by the decoding apparatus according to at least one example embodiment may be identified, but the example embodiments are not limited thereto, and for example, a different coding rate for the LDPC code may be used. In this case, a row processing order of the check node processing operations is described as a row index in the leftmost column of the table. In at least one example embodiment of FIG. 13A, the row processing order may be 4, 1, 5, 0, 2, and 3 as a row index, but the example embodiments are not limited thereto.

As described above, the row processing order according to at least one example embodiment may be configured such that a row having a relatively high weight and a row having a relatively low weight are alternately processed (e.g., a first high weight row is processed first, a first low weight row is processed second, a second high weight row is processed third, a second low weight row is processed fourth, etc.). In at least one example embodiment of FIG. 13A, after check node processing operations are performed on a row having a relatively low weight of 3 and a row index of 4, check node processing operations may be performed on a row having a relatively high weight of 19 and a row index of 1, etc. In addition, after the check node processing operations are performed on the row having a row index of 1, check node processing operations may be performed on a row having a relatively low weight of 8 and a row index of 5, etc.

In addition, a column check node processing order for columns corresponding to each row index is described on the right side of the row index. In at least one example embodiment of FIG. 13A, the column check node processing order for columns included in a row having a row index of 4 may be 26, 0, and 1 as a column index, and the column check node processing order for columns included in a row having a row index of 1 may be 23, 2, 5, 9, 15, . . . as a column index, but the example embodiments are not limited thereto.

Referring to FIG. 13B, a processing order of variable node processing operations for decoding of an LDPC code having a coding rate of, e.g., 22/28 by the decoding apparatus according to at least one example embodiment may be identified. In this case, a row processing order of the variable node processing operations is shown as a row index in the leftmost column of the table. In at least one example embodiment of FIG. 13B, the row processing order may be 4, 1, 5, 0, 2, and 3 as a row index, and this may be the same as the row processing order of the check node processing operations shown in FIG. 13A, but the example embodiments are not limited thereto.

In addition, a column variable node processing order for columns corresponding to each row index is shown on the right side of the row index. In at least one example embodiment of FIG. 13B, the column check node processing order for columns included in a row having a row index of 4 may be 0, 1, and 26 as a column index, and the column check node processing order for columns included in a row having a row index of 1 may be 0, 3, 12, 16, 21, . . . as a column index, but the example embodiments are not limited thereto. In this case, as shown in FIGS. 13A and 13B, a column check node processing order and a column variable node processing order for the same row index may be different from each other, but are not limited thereto.

FIGS. 14A to 14D are diagrams illustrating an example of a scheduling table used by the decoding apparatus, according to at least one example embodiment.

Referring to FIGS. 14A to 14D, a scheduling table generated according to and/or based on the processing order as shown in FIGS. 13A and 13B may be identified, but is not limited thereto. In this case, in the scheduling table of FIGS. 14A to 14D, check node processing operations and variable node processing operations may sequentially start in a pipelined manner, similar to the scheduling table of FIGS. 12A to 12D, but the example embodiments are not limited thereto.

However, in FIG. 14A, although a check node processing operation for a row having a row index of 4, the row being positioned and/or scheduled first in a row processing order, starts later than a check node processing operation for a row having a row index of 1, the row being positioned and/or scheduled later in the row processing order, the check node processing operation for the row having a row index of 4 may start before the check node processing operation for all columns included in the row having a row index of 1 has been completed, and, therefore, the check node processing operation for the row having a row index of 4 may be completed earlier.

As described above, according to at least one example embodiment, the decoding apparatus may decode an LDPC code by performing processing on a column included in a second row of the parity check matrix before processing on all columns included in a first row of the parity check matrix is completed. Accordingly, unlike the comparative example embodiment shown in FIG. 12C, a stall that may occur while the check node processing operation is performed on the row having a row index of 4 may be reduced, avoided, and/or prevented.

Also, in FIGS. 14A and 14B, a check node processing operation for a row having a row index of 5, the row being positioned and/or scheduled earlier in the row processing order, may start later than a check node processing operation for a row having a row index of 0, the row being positioned and/or scheduled later in the row processing order, but the example embodiments are not limited thereto. In addition, the check node processing operation for the row having a row index of 5 may start before the check node processing operation for all columns included in the row having a row index of 0 has completed, and the check node processing operation for the row having a row index of 5 may be completed earlier, but the example embodiments are not limited thereto.

Figure 14C:
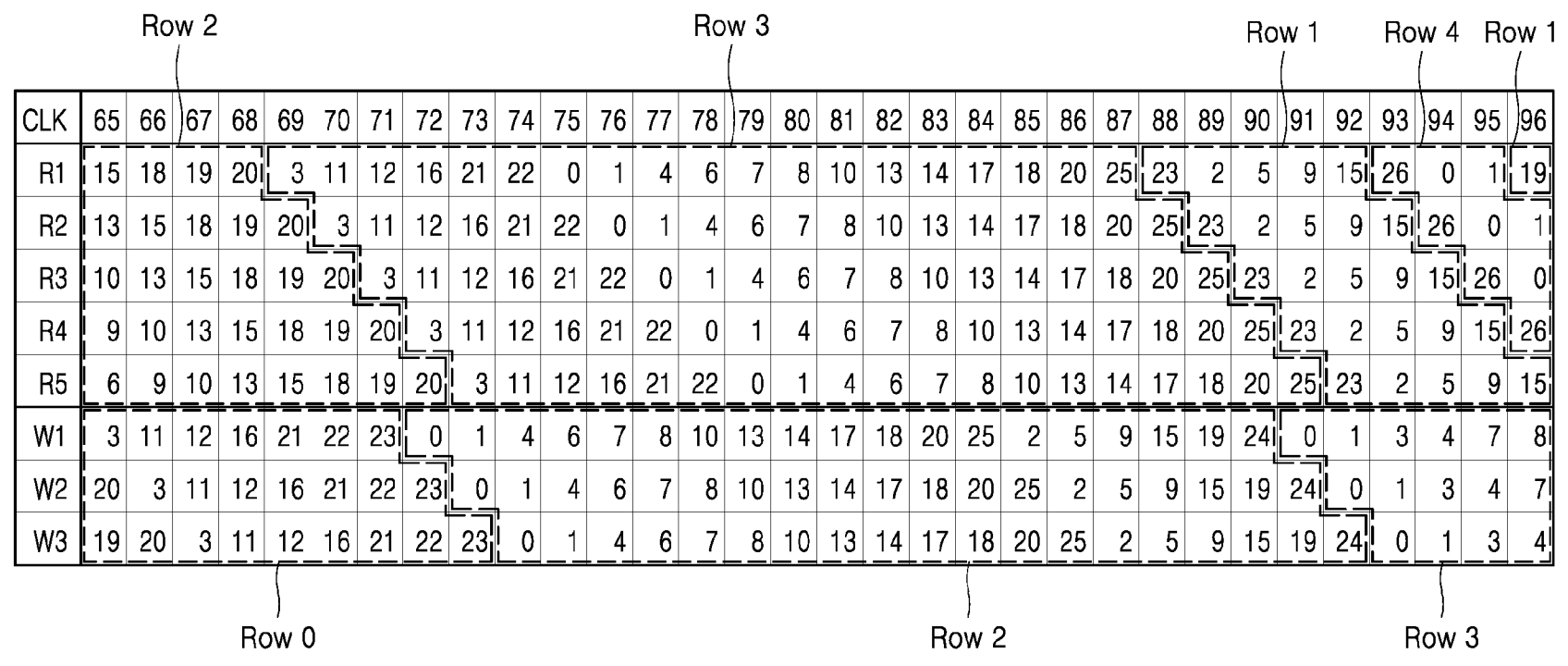
Figure 14D:
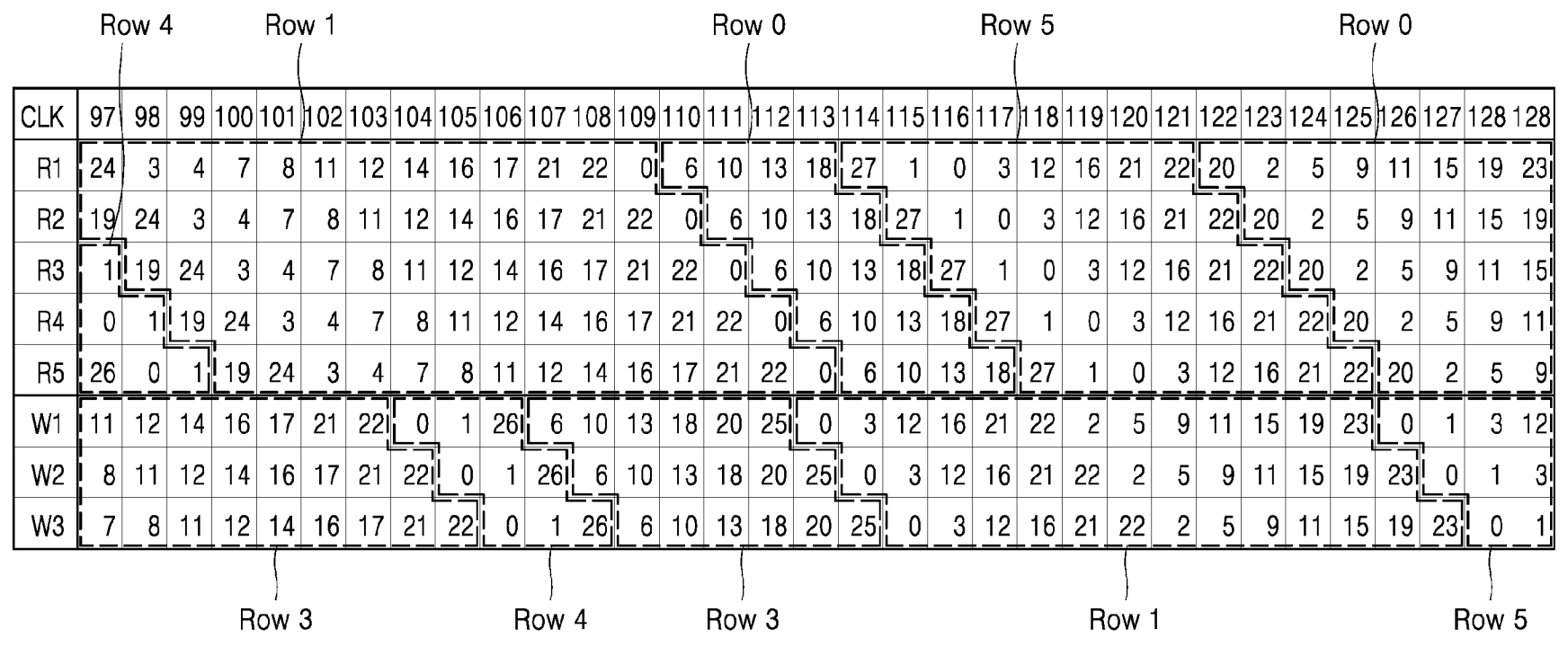

Similarly, even in FIGS. 14C and 14D, in which repeated processing for rows having row indices of 1, 4, 0, and 5 are shown, it may be identified that processing is configured to be performed on a column included in a second row of the parity check matrix before processing on all columns included in a first row of the parity check matrix is completed.

In this case, when the decoding apparatus according to the comparative example of FIGS. 11A to 12D is compared with the decoding apparatus according to at least one example embodiment of FIGS. 13 and 14, it may be identified that the decoding apparatus according to the comparative example requires a total of 103 clocks to complete the check node processing operation once, whereas the decoding apparatus according to at least one example embodiment requires a total of 87 clocks to complete the check node processing operation once.

As described above, according to at least one example embodiment, the decoding apparatus may decode the LDPC code at a higher speed and/or within a reduced amount of time by removing a stall that may occur in the middle of decoding by using the processing order shown in FIGS. 13A to 14D and the scheduling table indicating the processing order.

FIGS. 15A to 15C are diagrams illustrating an example of an order of performing check node processing and variable node processing by the decoding apparatus, according to at least one example embodiment.

Referring to FIG. 15A, a processing order of check node processing operations for decoding of an LDPC code having a coding rate of, e.g., 22/36 by the decoding apparatus according to at least one example embodiment may be identified, but the example embodiments are not limited thereto, and for example, a different coding rate for the LDPC code may be used. In this case, a row processing order of the check node processing operations is described as a row index in the leftmost column of the table. In at least one example embodiment of FIG. 15A, the row processing order may be 4, 1, 5, 0, 6, 3, . . . as a row index, but is not limited thereto.

As described above, the row processing order according to at least one example embodiment may be configured such that a row having a relatively high weight and a row having a relatively low weight are alternately processed. In at least one example embodiment of FIG. 15A, after check node processing operations are performed on a row having a relatively low weight of 3 and a row index of 4, check node processing operations may be performed on a row having a relatively high weight of 19 and a row index of 1, etc., but the example embodiments are not limited thereto. In addition, after the check node processing operations are performed on the row having a row index of 1, check node processing operations may be performed on a row having a relatively low weight of 8 and a row index of 5, etc.

In addition, a column check node processing order for columns corresponding to each row index is described on the right side of the row index. In at least one example embodiment of FIG. 15A, the column check node processing order for columns included in a row having a row index of 4 may be 26, 1, and 0 as a column index, and the column check node processing order for columns included in a row having a row index of 1 may be 2, 4, 5, 8, 9, . . . as a column index, but the example embodiments are not limited thereto.

Referring to FIG. 15B, a processing order of variable node processing operations for decoding of an LDPC code having a coding rate of, for example, 22/36 by the decoding apparatus according to at least one example embodiment may be identified, but the example embodiments are not limited thereto, and for example, a different coding rate for the LDPC code may be used. In this case, FIG. 15B illustrates a column variable node processing order for columns respectively corresponding to variable nodes that do not correspond to a puncturing area and/or a diagonal matrix area of a parity check matrix.

In this case, a row processing order of the variable node processing operations is described as a row index in the leftmost column of the table. In at least one example embodiment of FIG. 15B, the row processing order may be 4, 1, 5, 0, 6, 3, . . . as a row index, and this may be the same as the row processing order of the check node processing operations shown in FIG. 15A.

In addition, a column variable node processing order for columns corresponding to each row index is described on the right side of the row index. In at least one example embodiment of FIG. 15B, because all columns included in a row having a row index of 4 correspond to the puncturing area or the diagonal matrix area of the parity check matrix, a column check node processing order may not be described. In addition, a column check node processing order for columns included in a row having a row index of 1 may be 3, 12, 16, 21, 22, . . . as a column index.

Referring to FIG. 15C, a processing order of variable node processing operations for decoding of an LDPC code having a coding rate of, e.g., 22/36 by the decoding apparatus according to at least one example embodiment may be identified, but the example embodiments are not limited thereto, and for example, a different coding rate for the LDPC code may be used. In this case, FIG. 15C illustrates a column variable node processing order for columns respectively corresponding to variable nodes that correspond to the puncturing area and/or the diagonal matrix area of the parity check matrix.

In this case, a row processing order of the variable node processing operations is shown as a row index in the leftmost column of the table. In at least one example embodiment of FIG. 15C, the row processing order may be 4, 1, 5, 0, 6, 3, . . . as a row index, and this may be the same as the row processing order of the check node processing operations shown in FIGS. 15A and 15B, but the example embodiments are not limited thereto.

In addition, a column variable node processing order for columns corresponding to each row index is shown on the right side of the row index. In at least one example embodiment of FIG. 15C, the column check node processing order for the columns included in the row having a row index of 4 may be 0, 1, and 26 as a column index, but is not limited thereto. In addition, a column check node processing order for columns included in a row having a row index of 1 may be 0 as a column index, but is not limited thereto.

FIGS. 16A to 16F are diagrams illustrating an example of a scheduling table used by the decoding apparatus, according to at least one example embodiment.

Referring to FIGS. 16A to 16F, a scheduling table generated according to and/or based on the processing order as shown in FIGS. 15A to 15C may be identified, but the example embodiments are not limited thereto.

In the leftmost column of the scheduling table, numbers of and/or corresponding to check node processing operations and variable node processing operations are shown. In this case, in the case of the variable node processing operations, a variable node processing operation for columns that do not correspond to a puncturing area and/or a diagonal matrix area are represented by VNP0, and a variable node processing operation for columns corresponding to the puncturing area and/or the diagonal matrix area is represented by VNP1. In this case, in the scheduling table of FIGS. 16A to 16F, the check node processing operations and the variable node processing operations may sequentially start in a pipelined manner, similar to the scheduling table of FIGS. 14A to 14D.

In some example embodiments of FIGS. 16A to 16F, operation W3 of the variable node processing operation for the columns corresponding to the puncturing area and/or the diagonal matrix area may be omitted. This is because operation S830 corresponding to operation W3 is an operation of storing a posterior probability value in a posterior probability value memory, and a second posterior probability value memory storing a second posterior probability value corresponding to the puncturing area and/or the diagonal matrix area is implemented through a flip-flop, which enables processing without using a clock (e.g., a clock signal, and therefore do not have to occur during a desired clock cycle).

Also, in at least one example embodiments of FIGS. 16A to 16F, operation R1 for a column corresponding to the diagonal matrix area as indicated by shades in FIG. 15A may be omitted. In this regard, because operation S710 corresponding to operation R1 is an operation of reading a posterior probability value from a posterior probability value memory, and an initial posterior probability value corresponding to the diagonal matrix area is stored in a diagonal matrix memory, operation R1 may be omitted.

Figure 16A:
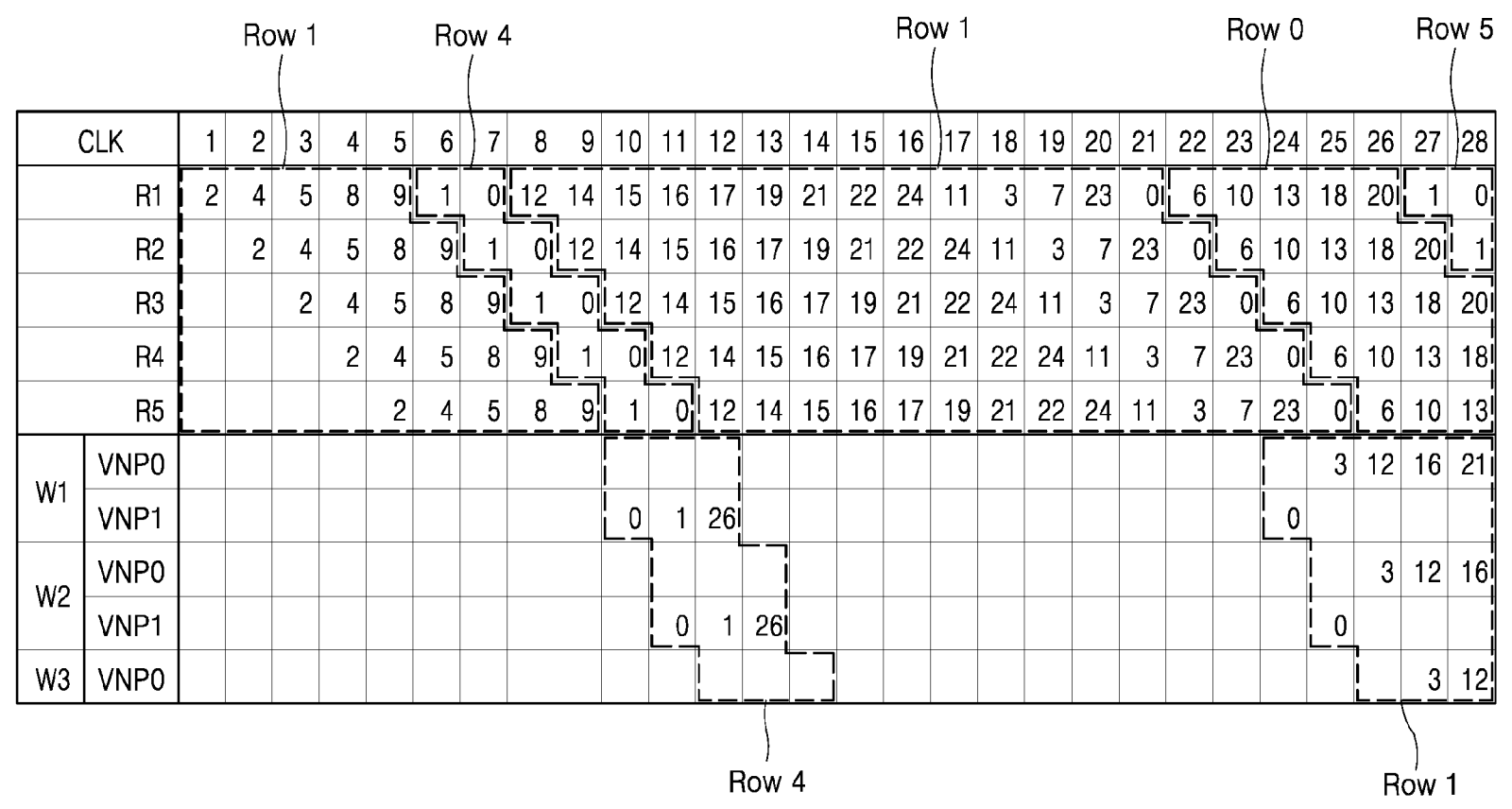

In addition, according to some example embodiments of FIGS. 16A to 16F, similar to some example embodiments of FIG. 14A, in FIG. 16A, although a check node processing operation for a row having a row index of 4, the row being positioned and/or scheduled first in a row processing order, starts later than and/or after a check node processing operation for a row having a row index of 1, the row being positioned and/or scheduled later in the row processing order, the check node processing operation for the row having a row index of 4 may start before the check node processing operation for all columns included in the row having a row index of 1 have completed, and the check node processing operation for the row having a row index of 4 may be completed earlier.

In FIG. 14A, operation W1 for a row having a row index of 4 starts from a column having a column index of 0 and is performed in a twelfth clock cycle. This time point may be the same time point as an execution time of operation R5 for a column having a column index of 1 in the row having a row index of 4. However, in FIG. 16A, operation W1 for a row having a row index of 4 may be performed in a tenth clock cycle, which is one clock cycle earlier than an eleventh clock cycle in which operation R5 for the row having a row index of 4 ends. As described above, when a column index at which operation R1 is performed last and a column index at which operation W1 is performed first are the same for rows having the same row index, operations R5 and W1 may be scheduled to overlap two clock cycles. This is because the minimum value used in operation W2 is calculated excluding a column index value being calculated, and thus, the calculated minimum value excluding the column index value may be used.

As described above, according to at least one example embodiment, the decoding apparatus may decode an LDPC code by performing processing on a column included in a second row of the parity check matrix before processing on all columns included in a first row of the parity check matrix has completed. Accordingly, unlike the comparative embodiment shown in FIG. 12C, a stall that may occur while the check node processing operation is performed on the row having a row index of 4 may be reduced and/or prevented.

Also, in FIGS. 16A and 16B, a check node processing operation for a row having a row index of 5, the row being positioned and/or scheduled earlier in the row processing order, may start later than and/or after a check node processing operation for a row having a row index of 0, the row being positioned (and/or scheduled) later in the row processing order. In addition, the check node processing operation for the row having a row index of 5 may start before the check node processing operation for all columns included in the row having a row index of 0 has completed, and therefore the check node processing operation for the row having a row index of 5 may be completed earlier.

Figure 16C:
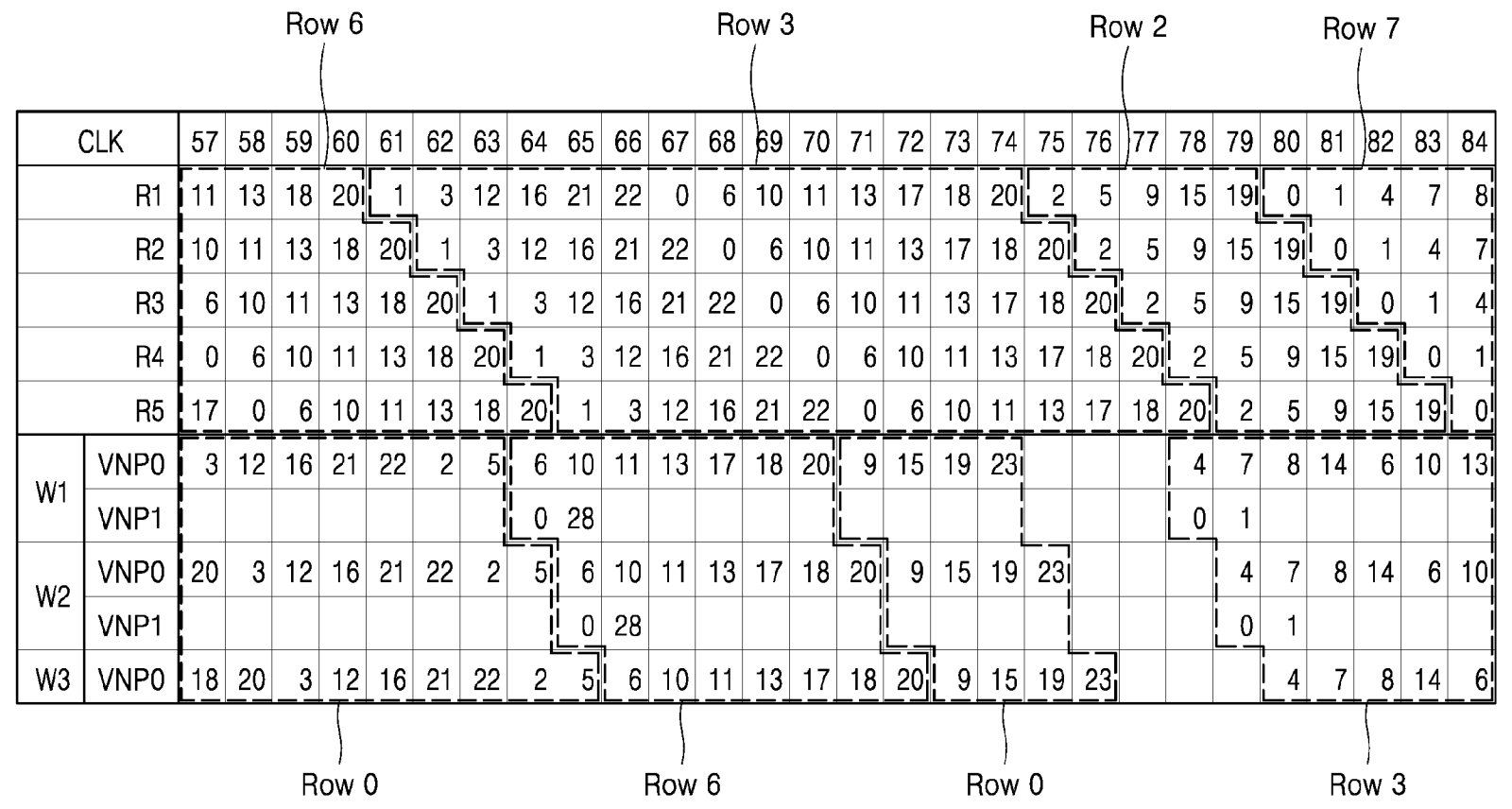
Figure 16E:
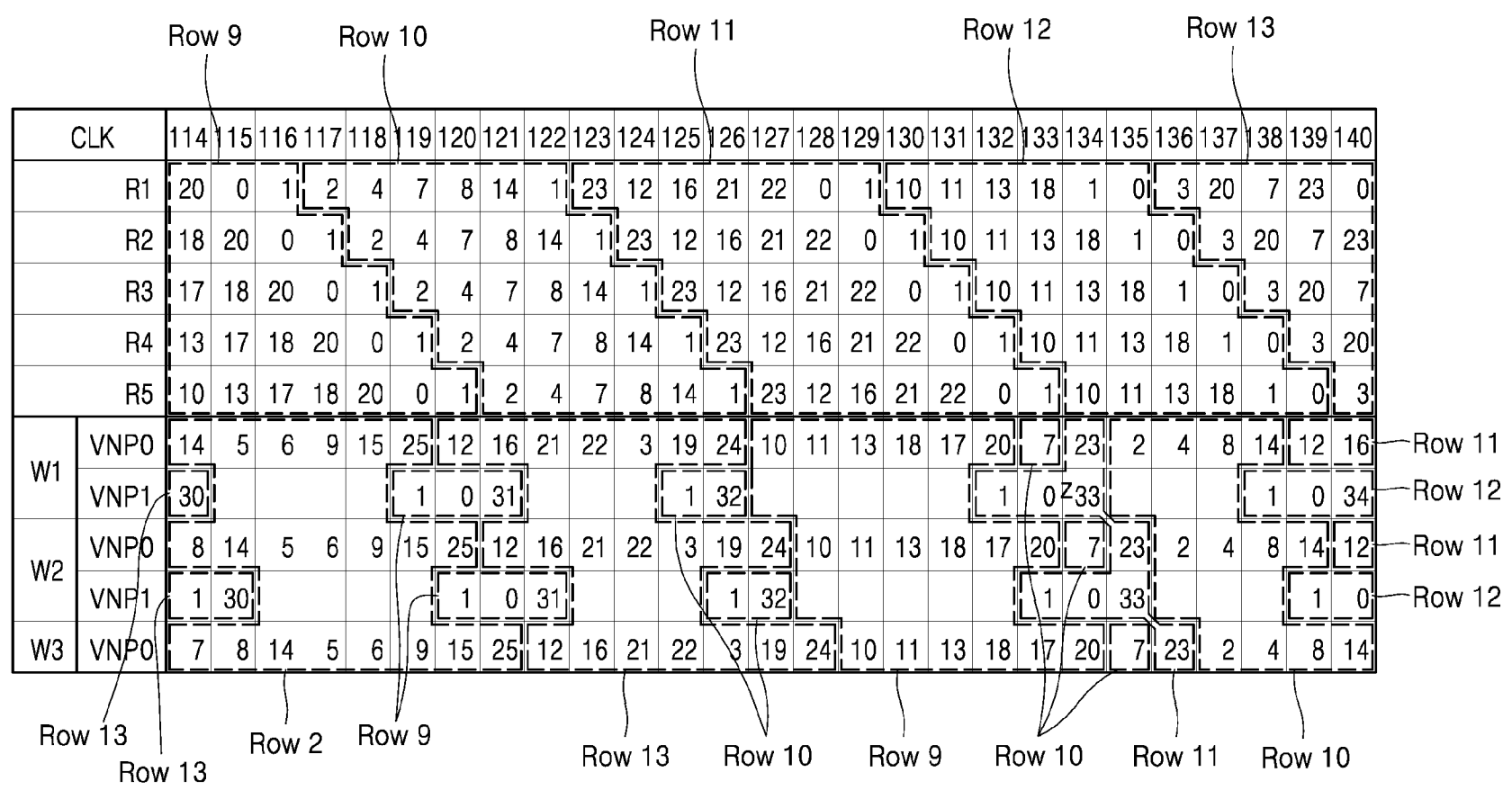

Also, in FIGS. 16B and 16C, a check node processing operation for a row having a row index of 6, the row being positioned and/or scheduled earlier in the row processing order, may start later than a check node processing operation for a row having a row index of 3, the row being positioned and/or scheduled later in the row processing order. In addition, the check node processing operation for the row having a row index of 6 may start before the check node processing operation for all columns included in the row having a row index of 3 has completed, and the check node processing operation for the row having a row index of 6 may be completed earlier.

Also, in FIGS. 16C and 16D, a check node processing operation for a row having a row index of 7, the row being positioned and/or scheduled earlier in the row processing order, may start later than a check node processing operation for a row having a row index of 2, the row being positioned and/or scheduled later in the row processing order. In addition, the check node processing operation for the row having a row index of 7 may start before the check node processing operation for all columns included in the row having a row index of 2 has completed, and the check node processing operation for the row having a row index of 7 may be completed earlier.

Figure 16F:
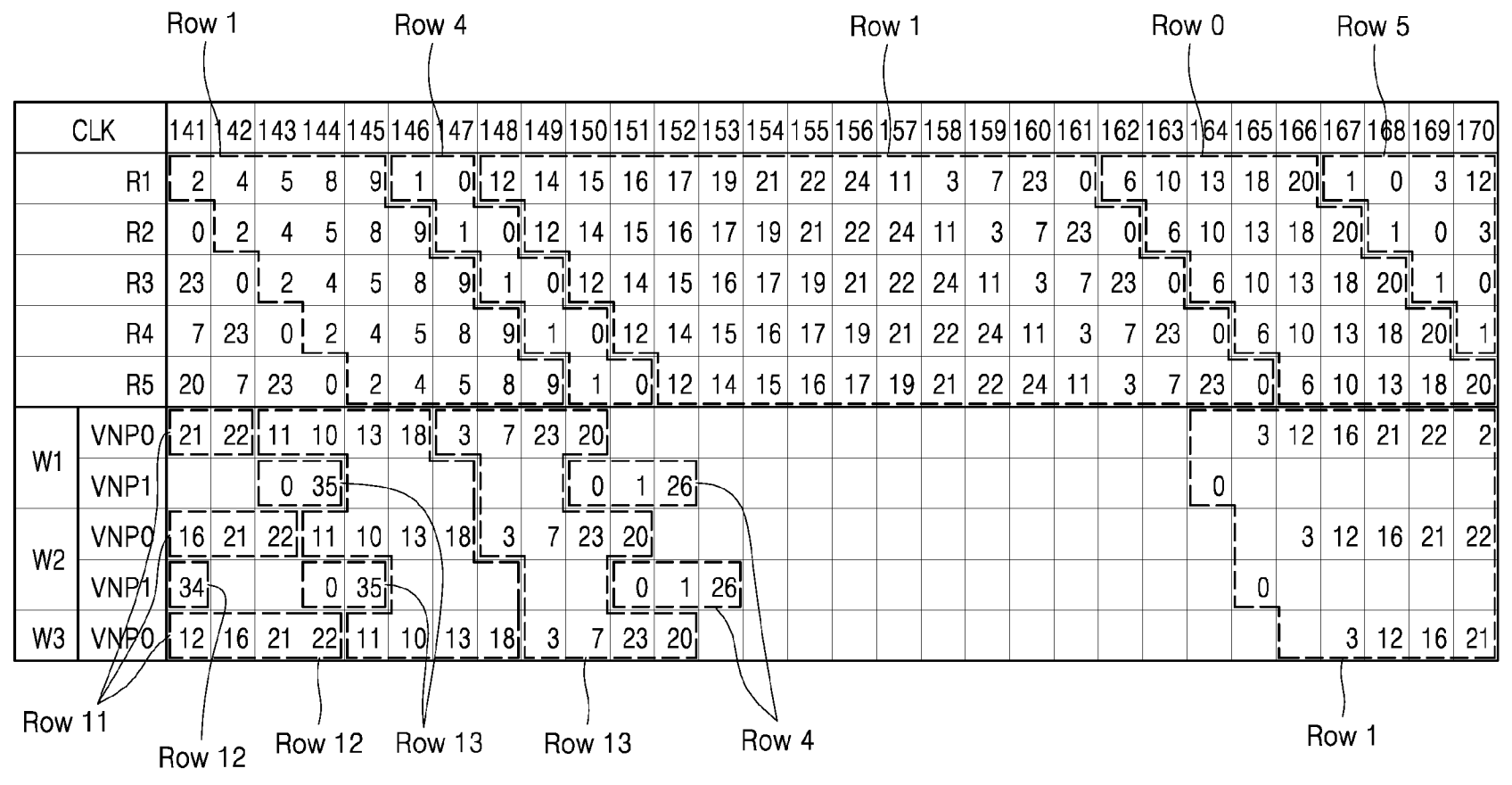

Similarly, even in FIG. 16F, in which repeated processing on rows having row indices of 1, 4, 0, and 5 are shown, it may be identified that processing is configured to be performed on a column included in a second row of the parity check matrix before processing on all columns included in a first row of the parity check matrix has been completed.

As described above, according to at least one example embodiment, the decoding apparatus may decode the LDPC code at a higher speed by removing and/or reducing a stall that may occur during and/or in the middle of decoding by using the processing order shown in FIGS. 15A to 16F and the scheduling table indicating the processing order. Also, according to at least one example embodiment, the decoding apparatus may decode the LDPC code at a higher speed by reducing unnecessary usage of clock cycles by separately performing processing on variable nodes corresponding to the puncturing area and/or the diagonal matrix area and variable nodes that do not correspond to the puncturing area and/or the diagonal matrix area.

While various example embodiments of the inventive concepts have been particularly shown and described herein, it will be understood that various changes in form and details may be made to the example embodiments without departing from the spirit and scope of the following claims.

What is claimed is:

1. A decoding apparatus for decoding a low density parity check (LDPC) code, the decoding apparatus comprising:
 a memory configured to store a scheduling table indicating a desired processing order of a plurality of rows included in a parity check matrix and a plurality of columns included in each of the rows of the parity check matrix, the desired processing order including a row processing order indicating an order in which processing on each row of the plurality of rows of the parity check matrix is to be completed, the row processing order based on a weight associated with each of the plurality of rows included in the parity check matrix; and processing circuitry configured to decode the LDPC code based on the scheduling table, the decoding including performing processing on at least one column included in a second scheduled row of the parity check matrix before processing of all columns included in a first scheduled row of the parity check matrix has been completed.

2. The decoding apparatus of claim 1, wherein the desired processing order further comprises:
a column check node processing order indicating an order of performing check node processing on the plurality of columns included in each row of the parity check matrix; and
a column variable node processing order indicating an order of performing variable node processing on the plurality of columns included in each row of the parity check matrix.

3. The decoding apparatus of claim 2, wherein
the weight associated with each row of the plurality of rows is proportional to a number of columns in the respective row on which to perform the check node processing and the variable node processing among the plurality of columns included in the respective row.

4. The decoding apparatus of claim 2, wherein the processing circuitry is further configured to:
perform check node processing on a desired column included in a fourth scheduled row of the parity check matrix after performing variable node processing on the desired column included in a third scheduled row of the parity check matrix has been completed.

5. The decoding apparatus of claim 1, wherein the processing circuitry is configured to decode the LDPC code by performing check node processing and variable node processing, the check node processing comprising a plurality of check node processing operations, and the variable node processing comprising a plurality of variable node processing operations.

6. The decoding apparatus of claim 5, wherein the processing circuitry is further configured to:
control the plurality of check node processing operations to be sequentially performed based on the desired processing order; and
control the plurality of variable node processing operations to be sequentially performed based on the desired processing order.

7. The decoding apparatus of claim 1, wherein the processing circuitry is further configured to:
store a plurality of posterior probability values respectively corresponding to a plurality of variable nodes in the memory;
store a plurality of check-variable values respectively transmitted from a plurality of check nodes to the plurality of variable nodes;
calculate a plurality of extrinsic values based on the plurality of check-variable values and the plurality of posterior probability values;
calculate a first minimum value and a second minimum value from the plurality of extrinsic values;
store the plurality of extrinsic values in the memory;
recalculate the plurality of check-variable values based on the first minimum value and the second minimum value; and
recalculate the plurality of posterior probability values based on the plurality of extrinsic values and the plurality of recalculated check-variable values.

8. The decoding apparatus of claim 7, wherein the processing circuitry is further configured to:
store a plurality of first posterior probability values respectively corresponding to variable nodes that do not correspond to a puncturing area or a diagonal matrix area of the parity check matrix in the memory; and
store a plurality of second posterior probability values respectively corresponding to variable nodes that correspond to the puncturing area or the diagonal matrix area of the parity check matrix in the memory.

9. The decoding apparatus of claim 8, wherein the processing circuitry is further configured to:
recalculate a plurality of first check-variable values respectively corresponding to the plurality of first posterior probability values;
recalculate a plurality of second check-variable values respectively corresponding to the plurality of second posterior probability values;
store the recalculated plurality of first check-variable values in the memory; and
store the recalculated plurality of second check-variable values in the memory.

10. The decoding apparatus of claim 9, wherein the processing circuitry is further configured to store a plurality of initial posterior probability values corresponding to a diagonal matrix area of the parity check matrix in the memory.

11. The decoding apparatus of claim 10, wherein the processing circuitry is further configured to:
recalculate the plurality of first posterior probability values based on the plurality of extrinsic values and the plurality of first check-variable values; and
recalculate the plurality of second posterior probability values based on the plurality of initial posterior probability values and the plurality of second check-variable values.

12. The decoding apparatus of claim 7, wherein the processing circuitry is further configured to:
calculate the first minimum value and the second minimum value for each row of the plurality of rows of the parity check matrix; and
store the first minimum value and the second minimum value calculated for each of the rows of the parity check matrix in the memory.

13. The decoding apparatus of claim 9, wherein the processing circuitry is further configured to:
store a plurality of first extrinsic values calculated based on the plurality of first posterior probability values in the memory;
store a plurality of second extrinsic values calculated based on the plurality of second posterior probability values in the memory;
recalculate the plurality of first posterior probability values based on the plurality of first extrinsic values and the plurality of first check-variable values; and
recalculate the plurality of second posterior probability values based on the plurality of second extrinsic values and the plurality of second check-variable values.

14. A decoding method of decoding a low density parity check (LDPC) code, the decoding method comprising:
  receiving the LDPC code; and
  decoding the LDPC code based on a scheduling table, the scheduling table indicating a processing order of a plurality of rows included in a parity check matrix and a plurality of columns included in each of the plurality of rows of the parity check matrix, the processing order including a row processing order indicating an order in which processing on each row of the plurality of rows of the parity check matrix is to be completed, the row processing order based on a weight associated with each of the plurality of rows included in the parity check matrix,
  the decoding of the LDPC code including performing processing on a column included in a second scheduled row of the parity check matrix before processing on all columns included in a first scheduled row of the parity check matrix has been completed.

15. The decoding method of claim 14, wherein the decoding of the LDPC code further includes:
  processing a check node, the processing the check node including,
  reading a posterior probability value from memory;
  reading a check-variable value from the memory;
  calculating a plurality of extrinsic values based on the check-variable value and the posterior probability value;
  calculating a first minimum value and a second minimum value among the plurality of calculated extrinsic values; and
  recalculating the check-variable value based on the first minimum value and the second minimum value.

16. The decoding method of claim 15, wherein the decoding of the LDPC code further includes processing a variable node, the processing of the variable node including,
  reading the extrinsic values from the memory;
  recalculating the posterior probability value based on the extrinsic values and the recalculated check-variable value; and
  storing the recalculated posterior probability value in the memory.

17. The decoding method of claim 16, wherein the processing of the check node and the processing of the variable node are sequentially performed based on the scheduling table.

* * * * *